United States Patent
Lee et al.

(10) Patent No.: US 10,418,374 B2
(45) Date of Patent: Sep. 17, 2019

(54) VERTICAL MEMORY DEVICES

(71) Applicant: Samsung Electronics Co., Ltd., Suwon-si (KR)

(72) Inventors: Eun-young Lee, Suwon-si (KR); Yong-hoon Son, Yongin-si (KR); Jae-young Ahn, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 44 days.

(21) Appl. No.: 15/398,081

(22) Filed: Jan. 4, 2017

(65) Prior Publication Data

US 2017/0345843 A1    Nov. 30, 2017

(30) Foreign Application Priority Data

May 27, 2016 (KR) .......... 10-2016-0065699

(51) Int. Cl.
*H01L 23/522* (2006.01)
*H01L 23/528* (2006.01)
(Continued)

(52) U.S. Cl.
CPC ...... *H01L 27/11582* (2013.01); *H01L 23/528* (2013.01); *H01L 23/5226* (2013.01); *H01L 23/544* (2013.01); *H01L 27/1157* (2013.01); *H01L 27/11573* (2013.01); *H01L 27/11575* (2013.01); *H01L 27/11578* (2013.01); *H01L 29/1037* (2013.01); *H01L 27/11565* (2013.01); *H01L 2223/544* (2013.01); *H01L 2223/54426* (2013.01)

(58) Field of Classification Search
CPC .......... H01L 27/11582; H01L 27/1157; H01L 27/11573; H01L 23/5226; H01L 23/528; H01L 27/11578; H01L 27/11575; H01L 27/11556; H01L 27/11551; H01L 23/544; H01L 2223/544; H01L 2223/54426
See application file for complete search history.

(56) References Cited

U.S. PATENT DOCUMENTS 8,278,170 B2* 10/2012 Lee ................ H01L 27/11551
                                                257/E21.645
8,809,938 B2  8/2014 Hwang et al.
(Continued)

FOREIGN PATENT DOCUMENTS

KR    20140063145    5/2014

OTHER PUBLICATIONS

US 9,230,972 B1, 01/2016, Shimabukuro et al. (withdrawn)

*Primary Examiner* — Allen L Parker
*Assistant Examiner* — Pauline Vu
(74) *Attorney, Agent, or Firm* — Onello & Mello, LLP

(57) ABSTRACT

A vertical memory device includes a plurality of stacked structures, at least one inter-structure layer, and a channel structure. The plurality of stacked structures comprises a plurality of gate electrodes and a plurality of insulation film patterns that are alternately and repeatedly stacked on a substrate. At least one inter-structure layer is positioned between the two stacked structures adjacent to each other from among the plurality of stacked structures. A channel structure penetrates the plurality of stacked structures and the at least one inter-structure layer, the channel structure extending in the first direction, the channel structure being connected to the substrate.

20 Claims, 54 Drawing Sheets

(51) Int. Cl.
*H01L 23/544* (2006.01)
*H01L 27/11582* (2017.01)
*H01L 27/1157* (2017.01)
*H01L 27/11573* (2017.01)
*H01L 27/11575* (2017.01)
*H01L 27/11578* (2017.01)
*H01L 29/10* (2006.01)
*H01L 27/11565* (2017.01)

(56) References Cited

U.S. PATENT DOCUMENTS

| | | |
|---|---|---|
| 9,117,923 B2 | 8/2015 | Shim et al. |
| 9,230,987 B2 | 1/2016 | Pachamuthu et al. |
| 9,236,395 B1 | 1/2016 | Sasaki |
| 9,236,396 B1 | 1/2016 | Koka et al. |
| 2001/0006246 A1* | 7/2001 | Kwag ............... C09K 13/04 257/522 |
| 2002/0149109 A1* | 10/2002 | Watanabe ......... H01L 21/76808 257/758 |
| 2005/0079683 A1* | 4/2005 | Sarma ................. G03F 9/7076 438/401 |
| 2010/0073671 A1* | 3/2010 | Chou ............... G03F 7/70633 356/237.4 |
| 2013/0234299 A1* | 9/2013 | Murakami .............. H01L 29/02 257/632 |
| 2015/0061155 A1 | 3/2015 | Seo et al. |
| 2015/0155296 A1* | 6/2015 | Yoon ................. H01L 27/11582 257/324 |
| 2015/0236038 A1* | 8/2015 | Pachamuthu ..... H01L 27/11582 257/326 |
| 2015/0279855 A1 | 10/2015 | Lu et al. |
| 2016/0005760 A1 | 1/2016 | Lee et al. |
| 2016/0260632 A1* | 9/2016 | Kang ............... H01L 21/31144 |
| 2017/0179026 A1* | 6/2017 | Toyama ........... H01L 27/11524 |

* cited by examiner

VERTICAL MEMORY DEVICES

CROSS-REFERENCE TO RELATED APPLICATION

This application claims the benefit of Korean Patent Application No. 10-2016-0065699, filed on May 27, 2016, in the Korean Intellectual Property Office, the disclosure of which is incorporated herein in its entirety by reference.

BACKGROUND

The inventive concepts relate to memory devices, and more particularly, to vertical memory devices.

In order to meet the consumer demands of high performance and reduced cost, it is desired to increase the integration of memory devices. As a result, vertical memory devices are under development, in which memory cells are stacked in a vertically direction relative to the underlying substrates.

SUMMARY

The inventive concepts provide vertical memory devices having improved reliability and increased manufacturing efficiency.

According to an aspect of the inventive concepts, there is provided a vertical memory device. The device includes a plurality of stacked structures, at least one inter-structure layer, and a channel structure. The plurality of stacked structures comprises a plurality of gate electrodes and a plurality of insulation film patterns that are alternately and repeatedly stacked on a substrate. At least one inter-structure layer is positioned between the two stacked structures adjacent to each other from among the plurality of stacked structures. A channel structure penetrates the plurality of stacked structures and the at least one inter-structure layer, the channel structure extending in the first direction, the channel structure being connected to the substrate.

According to another aspect of the inventive concepts, there is provided a vertical memory device comprising: a plurality of stacked structures, the stacked structures comprising gate electrodes and insulation film patterns that are alternately stacked on a substrate in a first direction that is perpendicular to a top surface of the substrate, the stacked structure extending in a second direction that is parallel to the top surface of the substrate; an inter-structure layer between the two stacked insulation film patterns adjacent to each other from among the plurality of insulation film patterns; and a channel structure that penetrates the stacked structures and the inter-structure layer, the channel structure layer contacting the substrate, and connected to the substrate, wherein a horizontal cross-sectional area of the channel structure parallel to the top surface of the substrate varies in the first direction.

According to another aspect of the inventive concepts, there is provided a vertical memory device comprising: a first stack structure comprising a plurality of gate electrodes and a plurality of insulation film patterns alternately stacked; a second stack structure comprising a plurality of gate electrodes and a plurality of insulation film patterns alternately stacked. The first stack structure is positioned on a substrate and the second stack structure is positioned on the first stack structure in a vertical direction relative the substrate, the substrate extending in a horizontal direction. An inter-structure layer is positioned between the first stack structure and the second stack structure. A channel structure penetrates the first stack structure, the inter-structure layer and the first stack structure in the vertical direction, the channel structure in contact with the substrate, the channel structure including a first channel structure portion extending through the first stack structure and a second channel structure portion extending through the second stack structure. The first channel structure portion has a width that reduces in a direction from a top to a bottom of the first channel structure portion relative to the substrate, and the second channel structure portion has a width that reduces in a direction from a top to a bottom of the second channel structure portion relative to the substrate; the channel structure changing in width at a vertical position proximal the inter-structure layer.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

Figure 1:
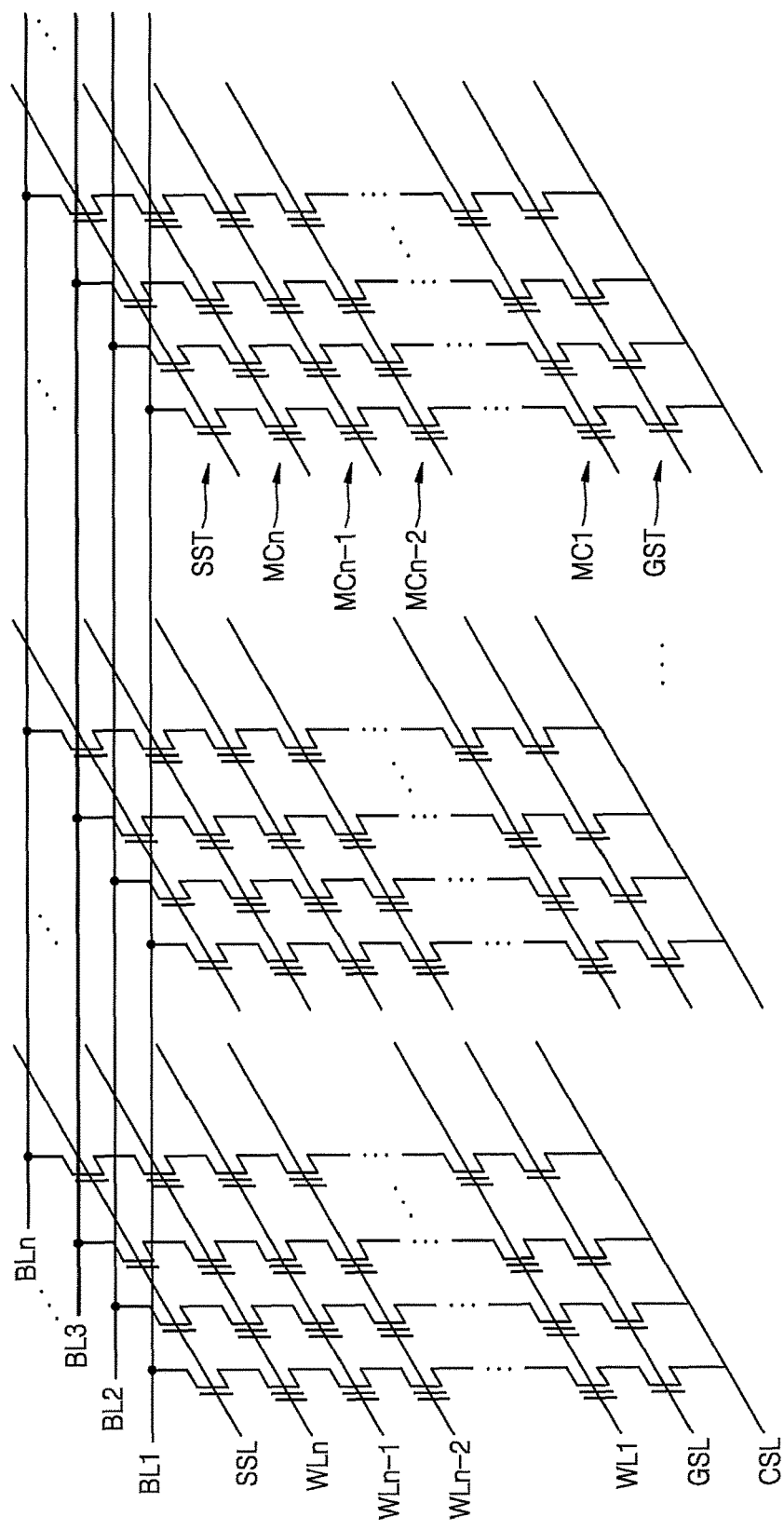
FIG. 1 is an equivalent circuit diagram of a vertical memory device according to an embodiment of the inventive concepts.

FIG. 1 is an equivalent circuit diagram showing the 3-dimensional structure of a memory cell array included in a non-volatile vertical memory device according to an embodiment of the inventive concepts.

Referring to FIG. 1, the memory cell array includes a plurality of memory cell strings each including n memory cell elements MC1 through MCn that are connected to one another in series and a ground selecting transistor GST and a string selecting transistor SST that are respectively connected in series to two opposite ends of the memory cell elements MC1 through MCn.

Gate terminals of the n memory cell elements MC1 through MCn connected to one another in series in the strings may be respectively connected to word lines WL1 through WLn for selecting at least some of the memory cell elements MC1 through MCn.

Gate terminals of the ground selecting transistors GST may be connected to a ground selecting line GSL, whereas source terminals of the ground selecting transistors GST may be connected to a common source line CSL. Meanwhile, gate terminals of the string selecting transistors SST may be connected to a string selecting line SSL, whereas source terminals of the string selecting transistors SST may be connected to drain terminals of the memory cell elements MCn.

Although FIG. 1 illustrates a structure in which a single ground selecting transistor GST and a single string selecting transistor SST are connected to the n memory cell elements MC1 through MCn connected to one another in series, in some embodiments a plurality of ground selecting transistors GST may be connected thereto in series, and, in some embodiments, a plurality of string selecting transistors SST may be connected thereto in series.

In some embodiments, drain terminals of the string selecting transistors SST may be connected to a corresponding bit line among bit lines BL1 through BLn. When a signal is applied to the gate terminal of the string selecting transistor SST via the string selecting line SSL, signals applied via the bit lines BL1 through BLn are transferred to the n memory cell elements MC1 through MCn connected to one another in series, and thus a data read operation or a data write operation may be executed. Furthermore, by applying a signal to the gate terminal of the ground selecting transistor GST via the ground selecting line GSL, an erase operation for removing all charge stored in the n memory cell elements MC1 through MCn may be executed.

Figure 2:
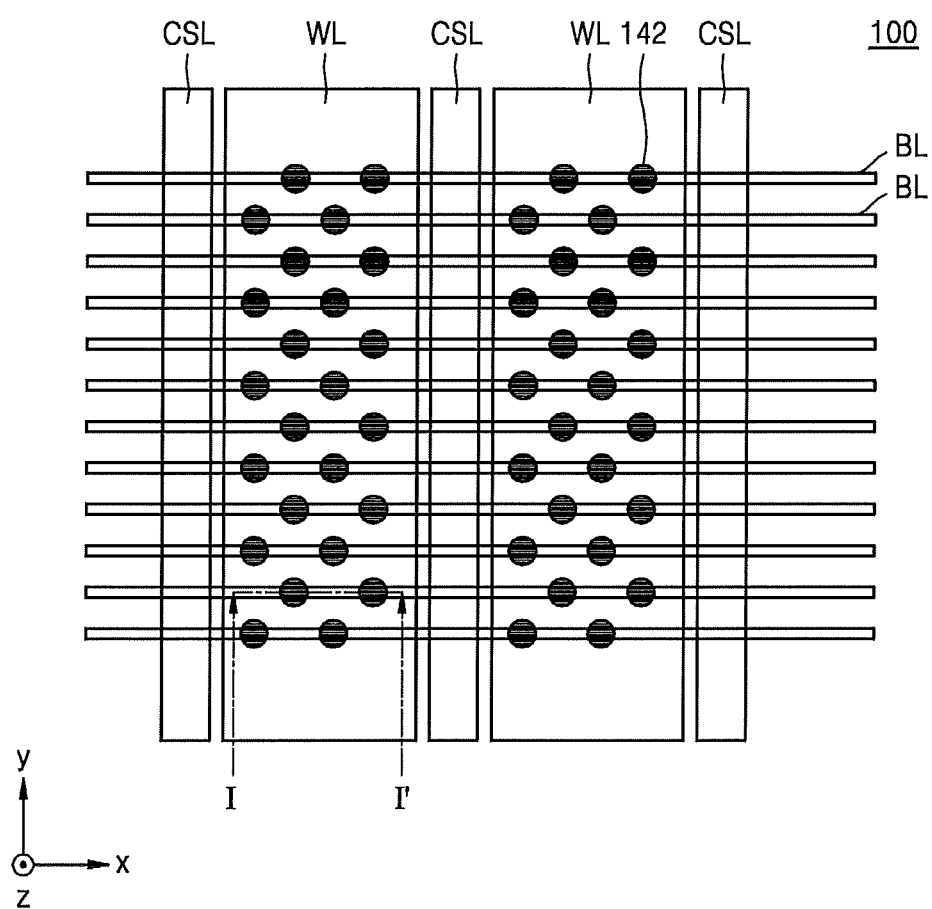
FIG. 2 is a plan view of a vertical memory device according to an embodiment of the inventive concepts.
Figure 3:
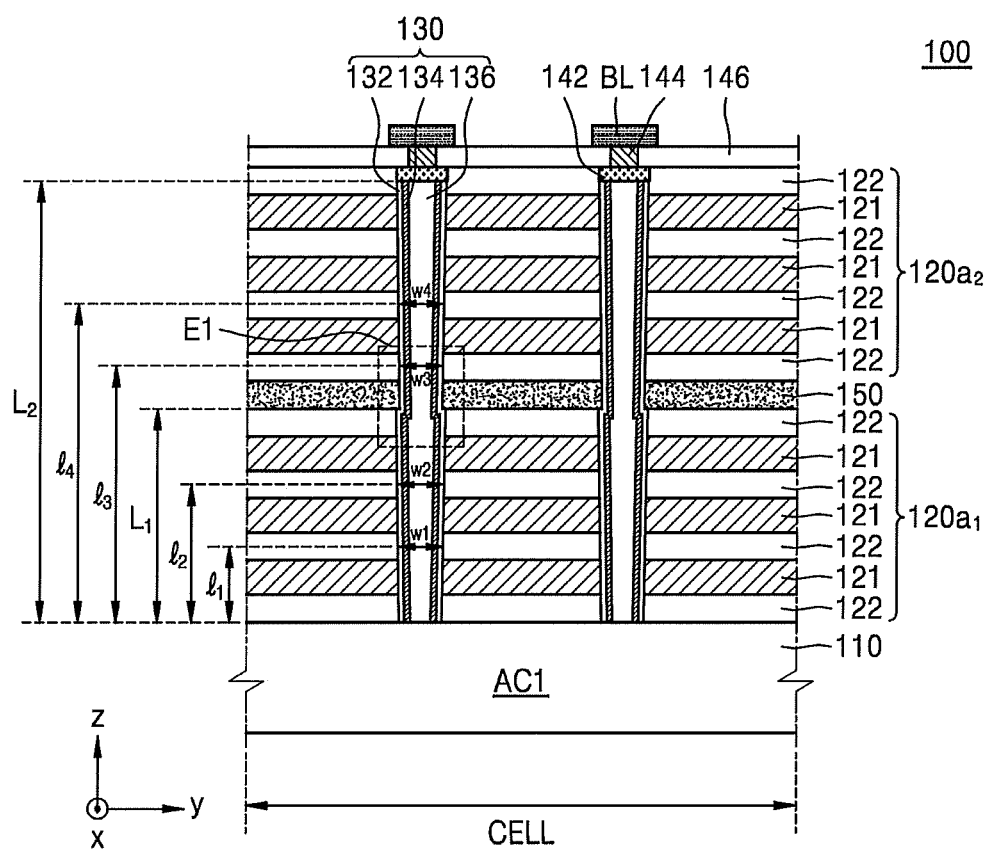
FIG. 3 is a sectional diagram of the vertical memory device, taken along section line I-I' of FIG. 2.
Figure 4:
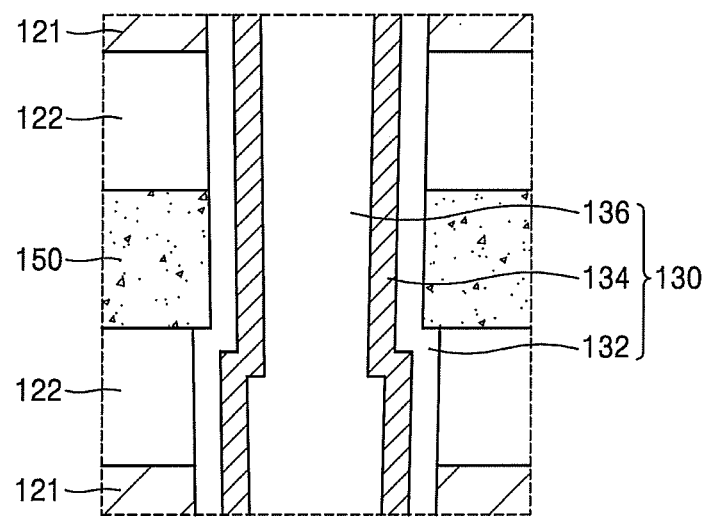
FIG. 4 is a close-up sectional diagram showing region E1 of the vertical memory device of FIG. 3.

FIG. 2 is a plan view of a vertical memory device 100 according to an embodiment of the inventive concepts. FIG. 3 is a sectional diagram of the vertical memory device 100, taken along sectional line I-I' of FIG. 2. FIG. 4 is a detailed, close-up, sectional diagram showing E1 of the vertical memory device of FIG. 3.

In FIGS. 2 through 4, a direction that is substantially perpendicular to the top surface of a substrate 110 will be defined as a first direction (z-axis direction), whereas two directions that are parallel to the top surface of the substrate 110 and intersect each other will be defined as a second direction (x-axis direction) and a third direction (y-axis direction). For example, the second direction (x-axis direction) may be substantially perpendicular to the third direction (y-axis direction). The second direction (x-axis direction) and the third direction (y-axis direction) are directions that are substantially perpendicular to the first direction (z-axis direction). In this sense, the first, second and third directions are orthogonal to each other. A direction indicated by an arrow and a direction opposite thereto will be referred to as a same direction. The definitions of directions above apply to all drawings herein.

Referring to FIGS. 2 through 4, in some embodiments, the substrate 110 may comprise a semiconductor material, e.g., silicon or germanium, or other suitable substrate material. The substrate 110 may function as a p-type well of the vertical memory device 100. The substrate 110 may be partitioned into multiple regions, for example, a cell array region CELL where memory cells are positioned and a peripheral circuit region PERI (refer to FIG. 11A) where supporting circuitry and supporting transistors are positioned. Although not shown, the substrate 110 may include a device isolating region that defines an active region. The active region may include a first active region AC1 defined in the cell array region CELL and a second active region AC2 defined in the peripheral circuit region PERI.

In some embodiments in accordance with the present inventive concepts, the vertical memory device 100 may include a first stack structure $120a_1$ disposed on the first active region AC1, a second stack structure $120a_2$ disposed on the first stack structure $120a_1$, a first inter-structure layer 150 between the first stack structure $120a_1$ and the second stack structure $120a_2$, and a channel structure 130 that penetrates through the first stack structure $120a_1$, the first inter-structure layer 150, and the second stack structure $120a_2$ in the first direction (z-axis direction) and is electrically connected to the substrate 110.

In some embodiments, a plug (not shown) may be positioned between the channel structure 130 and the substrate 110. In some embodiments, the plug may include a semiconductor material, e.g., silicon or germanium, or other suitable material. In some embodiments, the plug may function as a p-type well of the vertical memory device 100. In some embodiments, the plug may be provided by a selective epitaxial growth (SEG) operation.

The first stack structure $120a_1$ may include gate electrodes 121 and insulation film patterns 122 that are alternately and repeatedly stacked in the first direction (z-axis direction) and are parallel to the top surface of the substrate 110. In some embodiments, the first stack structure $120a_1$ includes a first uppermost layer contacting, or otherwise neighboring, the first inter-structure layer 150 and a first lowermost layer contacting, or otherwise neighboring, the substrate 110.

The second stack structure $120a_2$ may include gate electrodes 121 and insulation film patterns 122 that are alternately and repeatedly stacked in the first direction (z-axis direction) and are parallel to the top surface of the substrate 110. In some embodiments, the second stack structure $120a_2$ includes a second lowermost layer contacting, or otherwise neighboring, the first inter-structure layer 150 and a second uppermost layer that is the farthest from the substrate 110 in the first direction (z-axis direction).

According to some embodiments, the lowermost insulation film patterns 122 may be between the lowermost gate electrodes 121 and the substrate 110, whereas the uppermost insulation film patterns 122 may be disposed on the uppermost gate electrodes 121.

According to some embodiments, the lowermost gate electrodes 121 may be provided as the ground selecting line GSL shown in FIG. 1, whereas the uppermost gate electrodes 121 may be provided as the string selecting line SSL shown in FIG. 1. The gate electrodes 121 positioned between the ground selecting line GSL and the string selecting line SSL may be provided as word lines WL.

According to the present embodiment, the ground selecting line GSL, the word lines WL, and the string selecting line SSL include one layer, four layers, and one layer, respectively. However, although illustrative, embodiments of the inventive concept are not limited thereto. For example, in some embodiments, each of the ground selecting line GSL and the string selecting line SSL may include a single layer or two or more layers. Also, in some embodiments, the word lines WL may include $2^n$ layers, e.g., 4 layers, 8 layers, or 16 layers. The number of times the gate electrodes 121 are stacked may be determined by taking a desired circuit design and/or the desired integration of the resulting vertical memory device into account.

Each of the gate electrodes 121 may comprise a metal or a metal nitride, or other suitable conductive material. For example, the gate electrodes 121 may include a metal or a metal nitride having relatively low resistance, e.g., tungsten, a tungsten nitride, titanium, a titanium nitride, tantalum, a tantalum nitride, platinum, and the like. According to embodiments, each of the gate electrodes 121 may have a multilayer structure in which a barrier layer including a metal nitride and a metal layer are stacked.

In various embodiments, the insulation film patterns 122 may comprise an oxide-based material, such as silicon oxide ($SiO_2$), silicon oxycarbide (SiOC), or silicon oxyfluoride (SiOF), or other suitable insulative material. The gate electrodes 121 may be insulated from each other by the insulation film patterns 122.

The first inter-structure layer 150 may extend between the first stack structure $120a_1$ and the second stack structure $120a_2$ in the second direction (x-axis direction) and the third direction (y-axis direction). FIG. 3 illustrates an embodiment where the first inter-structure layer 150 contacts the first uppermost layer and the second lowermost layer. However, the inventive concept is not limited to the structure shown in FIG. 3. For example, there may be other intervening layers present between the first uppermost layer of the first stack structure $120a_1$ and the first inter-structure layer 150 and/or between the first inter-structure layer 150 and the second lowermost layer of the second stack structure $120a_2$.

According to embodiments, at least one of the first uppermost layer and the second lowermost layer may include the insulation film pattern 122. In some embodiments, the first uppermost layer and the second lowermost layer may be the insulation film patterns 122, whereas the first inter-structure layer 150 may be a dummy gate that exhibits conductivity, present at a level corresponding to a gate, and that does not function as an actual gate. In some embodiments, the material of the first inter-structure layer 150 may include a conductive material that is different from the material of the gate electrodes 121. In detail, the first inter-structure layer 150 may comprise polycrystalline silicon, or, alternatively, in some embodiments, may further include an n-type impurity, such as phosphor (P) and arsenic (As). Alternatively, the first inter-structure layer 150 may include a nitride-based material, such as silicon nitride (SiN) or silicon boron nitride (SiBN). However, embodiments of the inventive concepts are not limited thereto, and, in some embodiments, the first inter-structure layer 150 may include undoped polycrystalline silicon, for example.

Referring to FIG. 3, for purposes of the present illustration, the height of the uppermost surface of the first stack structure $120a_1$ relative to an upper surface of the substrate 110 in the first direction (z-axis direction) is referred to as a height L1. Also, the height of the uppermost surface of the channel structure 130 from the substrate 110 in the first direction (z-axis direction) is referred to as a height L2.

According to embodiments, two arbitrary heights l1 and l2 taken from an upper surface of the substrate 110 in the first direction (z-axis direction) may be defined to satisfy the relationship 0<l1<l2<L1. When the width of the channel structure 130 at a same level as the height l1 is referred to as a width w1 and the width of the channel structure 130 at a same level as the height l2 is referred to as a width w2, the widths w1 and w2 satisfy the relationship w1<w2. Furthermore, two arbitrary heights l3 and l4 of the channel structure 130 in the first direction (z-axis direction) may be defined to satisfy the relationship L1<l3<l4<L2. When the width of the channel structure 130 at a same level as the height l3 is referred to as a width w3 and the width of the channel structure 130 at a same level as the height l4 is referred to as a width w4, the widths w3 and w4 satisfy the relationship w3<w4.

According to embodiments, the sectional profile of the channel structure 130 may have a shape that has a slope that narrows, or tapers inwardly, in a direction toward the substrate 110 in the first direction (z-axis direction) and has an inflection point at a same level as the first inter-structure layer 150. In other words, the width of the channel structure 130 may be reduced in a direction between a top of the second stack structure $120a_2$ and a bottom of the second stack structure $120a_2$, and may be reduced in a direction between a top of the first stack structure $120a_1$ and a bottom of the first stack structure $120a_1$. However, the width of the channel structure 130 may have a relative increase in a region of the level of the first inter-structure layer 150 at the top of the first stack structure $120a_1$ and/or at the bottom of the second stack structure $120a_2$.

In some embodiments, the channel structure 130 may include a channel 134, a dielectric film structure 132 that surrounds the outer walls of the channel 134, and a channel burying film pattern 136 disposed inside the channel 134.

According to embodiments, the outer wall of the dielectric film structure 132 may be surrounded by the gate electrodes 121, the first inter-structure layer 150, and the insulation film patterns 122. The gate electrodes 121 may be formed on the outer walls of the dielectric film structure 132 and may be stacked apart from one another in the first direction (z-axis direction), separated from each other in that direction by the insulation film patterns 122. The gate electrodes 121, the first inter-structure layer 150, and the insulation film patterns 122 may partially surround the channels 134 and extend in the second direction (x-axis direction) and the third direction (y-axis direction).

A vertical memory device according to an embodiment may include a stacked structure including the gate electrodes 121 and the insulation film patterns 122 that are stacked on the substrate 110 in the first direction (z-axis direction) and are parallel to the top surface of the substrate 110, the inter-structure layer 150 that is between the two insulation film patterns 122 adjacent to each other from among the insulation film patterns 122, and the channel structure 130 that penetrates through the inter-structure layer 150, the gate electrodes 121 and the insulation film patterns 122 and contacts the substrate 110, whereas the horizontal cross-sectional area of the channel structure 130 taken in a direction parallel to the top surface of the substrate 110 may vary according to the first direction (z-axis direction).

In some embodiments, the horizontal cross-sectional area of the channel structure 130 may be greatest in a region of the first stack structure $120a_1$ at a same level as the inter-structure layer 150. In some embodiments, the general reduction in a downward direction of the horizontal cross-sectional area of the channel structure 130 may be discontinuous in the region or vicinity of the level of the inter-structure layer 150. In some embodiments, a rate of change rate of the horizontal cross-sectional area of the channel structure 130 in the first direction (z-axis direction) may be the greatest in the region or vicinity of the level of the inter-structure layer 150.

In some embodiments, the inter-structure layer 150 may comprise an insulation layer and may be in contact with the gate electrodes 121 of the first stack structure $120a_1$ and/or second stack structure $120a_2$. The inter-structure layer 150 may include polycrystalline silicon and, in some embodiments, may include an n-type impurity, such as a phosphor (P) and arsenic (As). Alternatively, the inter-structure layer 150 may include a nitride-based material, such as silicon nitride (SiN) or silicon boron nitride (SiBN).

Each of the channels 134 may be disposed in the cell array region CELL in a shape where two hollow circular truncated cones are stacked along the height axis in the first direction (z-axis direction). Here, the channels 134 may contact the top surface of the substrate 110, where a smaller one of bottom surfaces of circular portions of each of the circular truncated cones is disposed at a position that is proximal to the substrate 110. In some embodiments, the channels 134 may include polycrystalline silicon or monocrystalline silicon and may include a p-type impurity, e.g., boron (B).

The channel burying film pattern 136 is disposed inside the channels 134 in a shape where two solid circular truncated cones are stacked along the height axis in the first direction (z-axis direction). Here, the channel burying film pattern 136 may have a shape where a smaller one of bottom surfaces of circular portions of each of the circular truncated cones is disposed at a vertical position more proximal to the substrate 110. The channel burying film pattern 136 may include an insulation material such as a silicon oxide. According to embodiments, each of the channels 134 may have a structure where two solid circular truncated cones are stacked along the height axis in the first direction (z-axis direction), where the structure may have a shape where a smaller one of bottom surfaces of circular portions of each of the solid circular truncated cones is disposed at a vertical position closer to the substrate 110. In this case, the channel burying film pattern 136 may be omitted.

Although not shown, the dielectric film structure 132 may include, in various embodiments, a tunnel insulation film, a charge storage film, and a blocking film that are stacked in the order stated relative to the outer wall of the channel 134. The blocking film may include a metal oxide, such as a silicon oxide, a hafnium oxide, or an aluminum oxide. The charge storage film may include a nitride, such as a silicon nitride, or a metal oxide. The tunnel insulation film may include an oxide, such as a silicon oxide. For example, a stacked structure including the blocking film, the charge storage film, and the tunnel insulation film may have oxide-nitride-oxide (ONO) structure in which an oxide film, a nitride film, and an oxide film are sequentially stacked.

A semiconductor pattern (not shown) may be additionally formed between the top surface of the substrate 110 and the bottom surface of the channel 134. In this case, the channel 134 may be disposed on the top surface of the semiconductor pattern, whereas the dielectric film structure 132 may be disposed on the peripheral portion of the top surface of the semiconductor pattern. The semiconductor pattern may include monocrystalline silicon or polycrystalline silicon, for example.

In an embodiment where the above-stated semiconductor pattern is positioned between the channel 134 and the substrate 110, the gate electrodes 121 that may function as the ground selecting line GSL may extend and surround the outer walls of the semiconductor pattern. In this case, a gate insulation film (not shown) may be positioned further between the gate electrodes 121 and the outer walls of the semiconductor pattern.

A conductive pad 142 may be disposed on the dielectric film structure 132, the channel 134, and the channel burying film pattern 136. The conductive pad 142 may be formed to have a shape that operates to cap the dielectric film structure 132, the channel 134, and the channel burying film pattern 136. The conductive pad 142 may include doped polycrystalline silicon or doped monocrystalline silicon and may further include an n-type impurity, such as phosphor (P) and arsenic (As).

As shown in FIG. 2, the plurality of conductive pads 142 may be arranged in the second direction (x-axis direction) and the third direction (y-axis direction). Therefore, in correspondence to the arrangement of the conductive pads 142, the plurality of channel structures 130, each of which includes the channel 134, the dielectric film structure 132, and the channel burying film pattern 136, may be similarly arranged in the second direction (x-axis direction) and the third direction (y-axis direction).

According to embodiments, an upper insulation film 146 may be disposed on the second stack structure $120a_2$. The upper insulation film 146 may comprise an insulation material, e.g., a silicon oxide, or other suitable insulation material.

According to embodiments, bit line contacts 144 that penetrate through the upper insulation film 146 and contact the conductive pads 142 may be disposed, where the bit line contacts 144 may be electrically connected to the bit lines BL.

Figure 5:
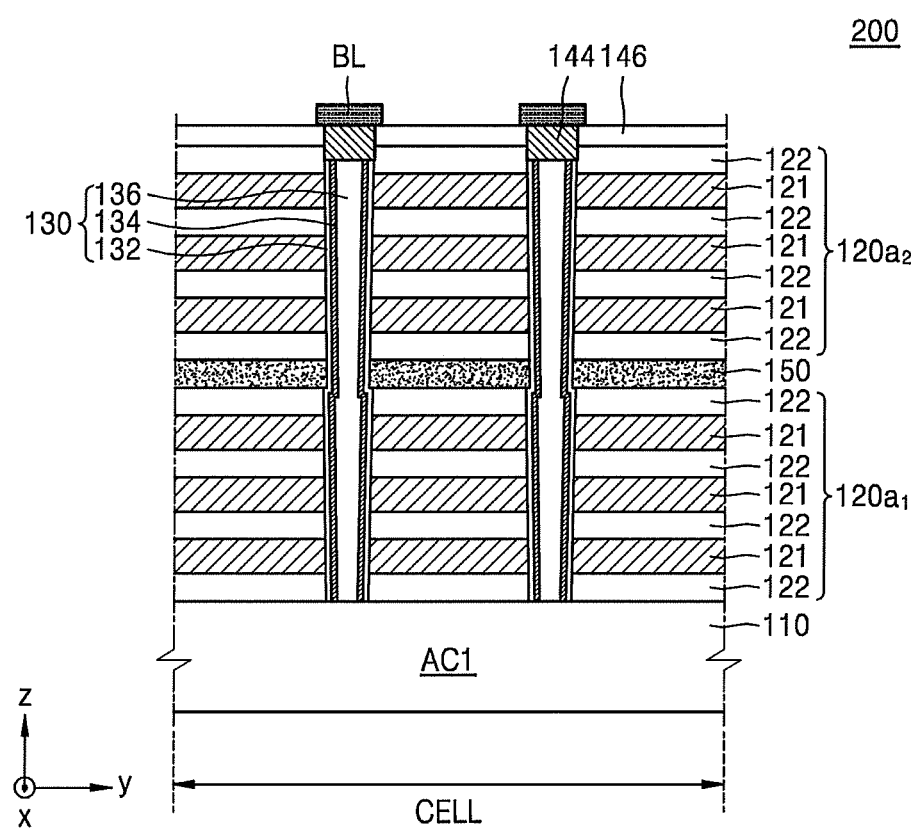
FIGS. 5 and 6 are sectional diagrams for describing a vertical memory device according to an embodiment of the inventive concepts.

FIG. 5 is a sectional diagram for describing a vertical memory device 200 according to an embodiment of the inventive concepts.

Hereinafter, for convenience of explanation, only those features that are different from those illustrated above with respect to FIGS. 2 through 4 are provided.

Referring to FIG. 5, the conductive pads 142 described above with reference to FIGS. 2 through 4 may be omitted. In other words, since the bit line contact 144 is formed directly on the dielectric film structure 132, the channel 134, and the channel burying film pattern 136, the channel 134 may be directly and electrically connected to the bit line contact 144.

Figure 6:
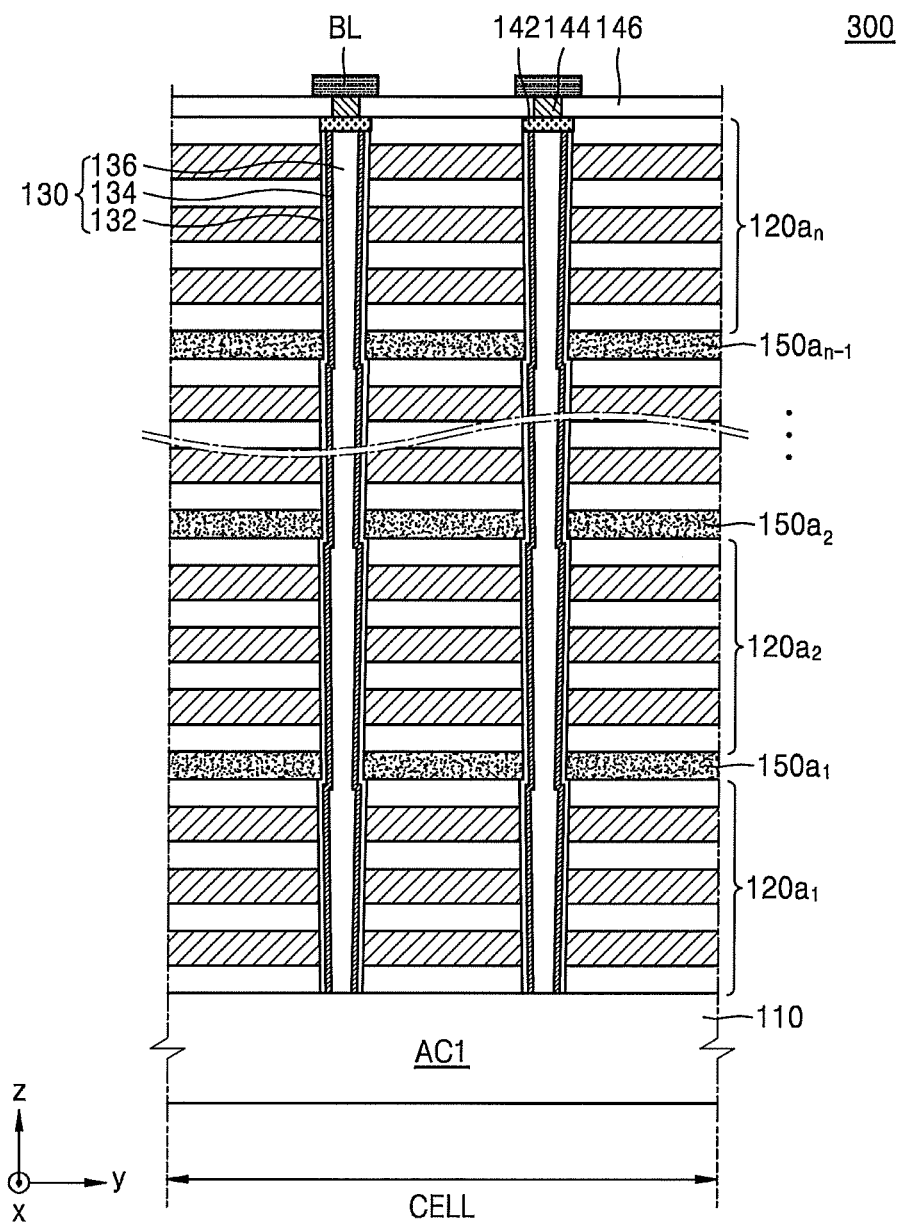

FIG. 6 is a sectional diagram for describing a vertical memory device 300 according to an embodiment of the inventive concepts.

Hereinafter, for convenience of explanation, only those features that are different from those illustrated above with respect to FIGS. 2 through 4 are provided.

Referring to FIG. 6, the vertical memory device 300 includes a plurality of stacked structures $120a_1, \ldots, 120_n$, each of which includes the gate electrodes 121 and the insulation film patterns 122 that are alternately and repeatedly stacked on the substrate 110 in the first direction (z-axis direction) that is perpendicular to the top surface of the substrate 110 and are parallel to the top surface of the substrate 110, at least one inter-structure layer $150a_1, 150a_2, \ldots,$ and $150a_{n-1}$ between every two adjacent stacked structures $121a_1, 121a_2, \ldots,$ and $121_{an}$ among the plurality of stacked structures $121a_1, 121a_2, \ldots,$ and $121a_n$, and a channel structure that penetrates the plurality of stacked structures $121a_1$, $121a_2$, ..., and $121a_n$ and the at least one inter-structure layer $150a_1$, $150a_2$, ..., and $150a_{n-1}$ in the first direction (z-axis direction) and is connected to the substrate 110.

Figure 7A:
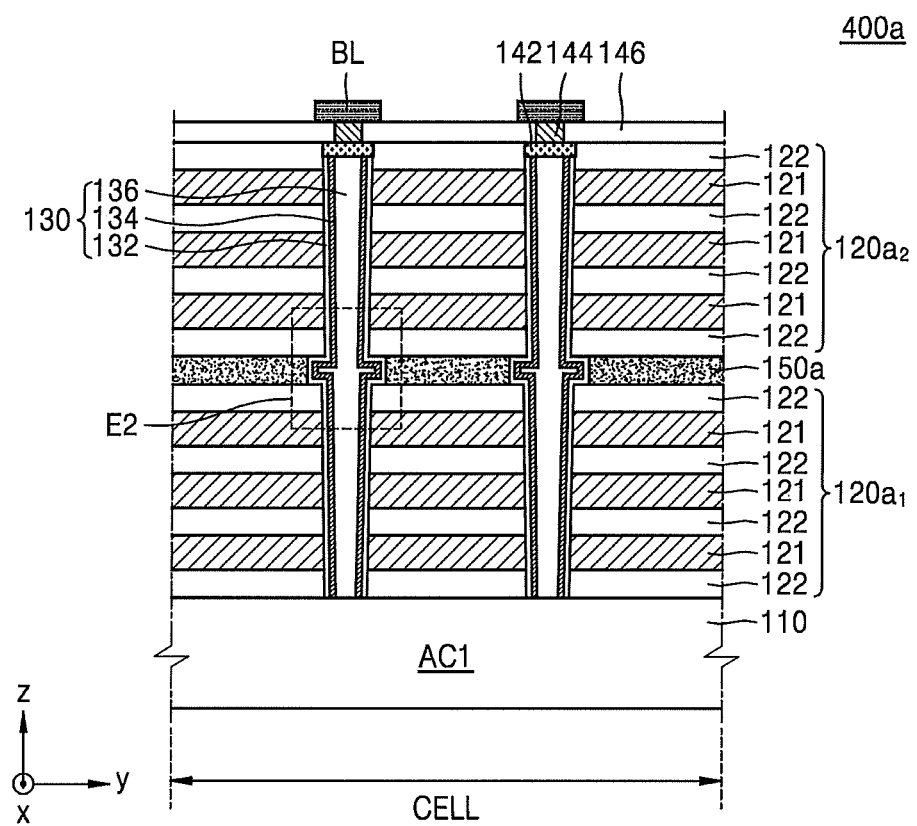
FIGS. 7A through 7C are sectional diagrams for describing a vertical memory device according to an embodiment of the inventive concepts.
Figure 8A:
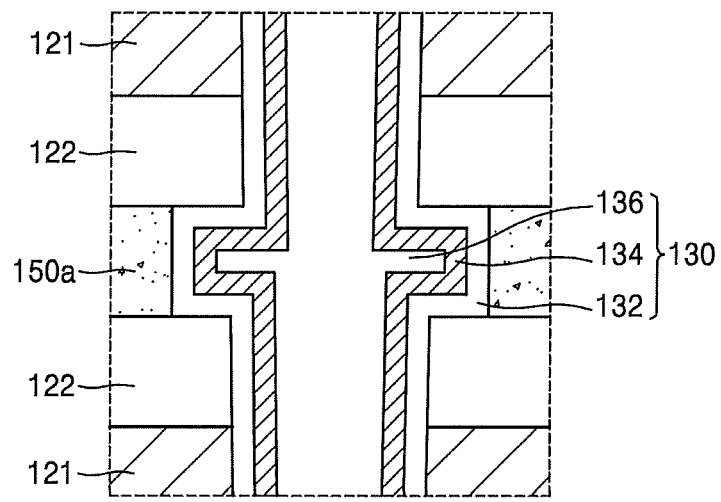
FIGS. 8A through 8C are sectional diagrams showing portions of FIGS. 7A through 7C in detail to further describe a vertical memory device according to an embodiment of the inventive concepts.

FIG. 7A is a sectional diagram for describing a vertical memory device 400a according to an embodiment of the inventive concepts. FIG. 8A is a sectional diagram showing region E2 of FIG. 7A in further detail to describe the vertical memory device 400a of FIG. 7A.

Hereinafter, for convenience of explanation, only those features that are different from those illustrated above with respect to FIGS. 2 through 4 are provided.

Referring to FIGS. 7A and 8A, a first inter-structure layer 150a, the first stack structure $120a_1$, and the second stack structure $120a_2$ are penetrated by the channel structures 130, thereby forming sidewalls of the first inter-structure layer 150a, sidewalls of the first stack structure $120a_1$, and sidewalls of the second stack structure $120a_2$. The sidewalls of the first inter-structure layer 150a may be further recessed in the horizontal directions to extend in an outward horizontal direction, as compared to at least one of the sidewalls of the first stack structure $120a_1$ and the sidewalls of the second stack structure $120a_2$. The sidewalls of the first inter-structure layer 150a may be further recessed in horizontal directions, as compared to both the sidewalls of the first stack structure $120a_1$ and the sidewalls of the second stack structure $120a_2$. The dielectric film structure 132 and the channel 134 are positioned conformally along the profile of the outer surface of the channel structure 130, where the channel burying film pattern 136 fills the interior of the channel 134. In detail, the channel structure 130 may have a cross-like sectional shape in the z-axis direction.

According to embodiments, the sectional profile of the channel structure 130 may include a concave-convex portion at a level in the vicinity of the first inter-structure layer 150a. In detail, the sectional profile of the channel structure 130 may include a portion that is outwardly convex at a level in the vicinity of as the first inter-structure layer 150a.

According to embodiments, the sectional profile of the channel structure 130 may include at least one inflection point at a level in the vicinity of the first inter-structure layer 150a.

Figure 7B:
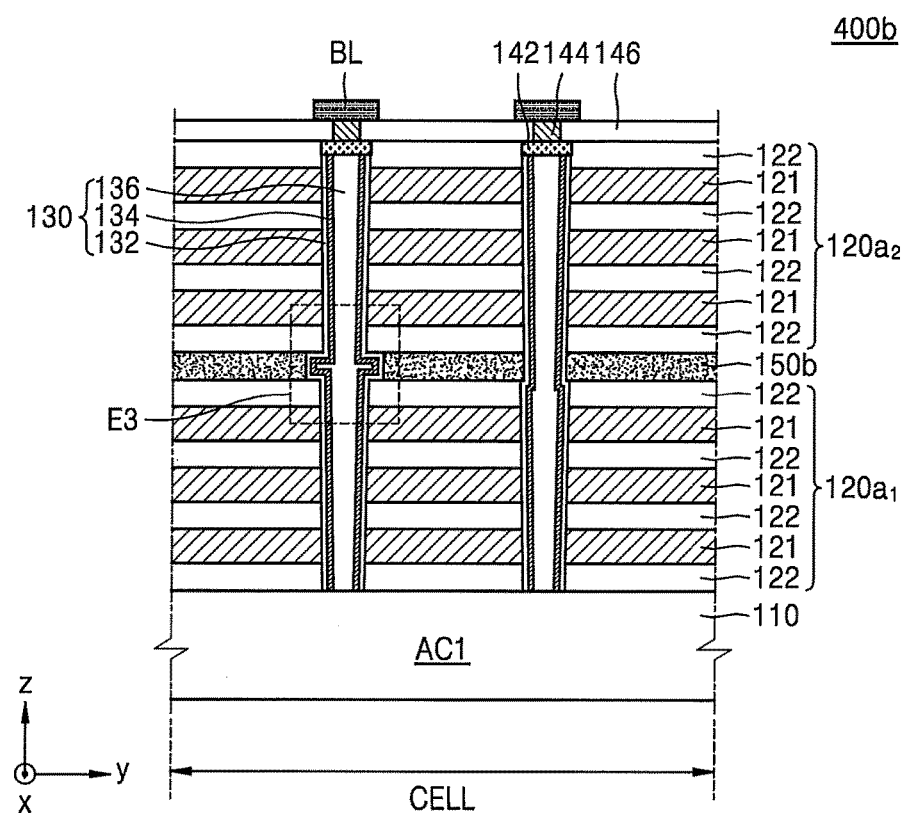
Figure 8B:
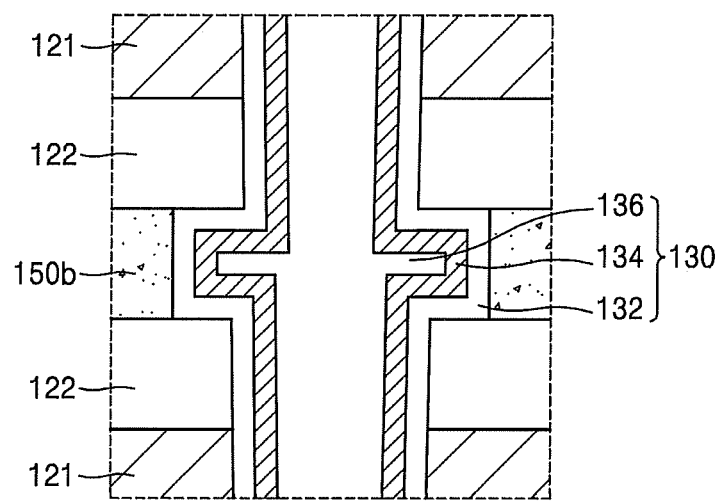

FIG. 7B is a sectional diagram for describing a vertical memory device 400b according to an embodiment of the inventive concepts. FIG. 8B is a sectional diagram showing region E3 of FIG. 7B in further detail to describe the vertical memory device 400b of FIG. 7B.

Hereinafter, for convenience of explanation, only those features that are different from those illustrated above with respect to FIGS. 7A and 8A are provided.

Referring to FIGS. 7B and 8B, a first inter-structure layer 150b, the first stack structure $120a_1$, and the second stack structure $120a_2$ are penetrated by the channel structures 130, thereby forming sidewalls of the first inter-structure layer 150b, sidewalls of the first stack structure $120a_1$, and sidewalls of the second stack structure $120a_2$. At least some of the sidewalls of the first inter-structure layer 150b may be further recessed in the horizontal directions, as compared to at least one of the sidewalls of the first stack structure $120a_1$ and the sidewalls of the second stack structure $120a_2$. The sidewalls of the first inter-structure layer 150b may be further recessed in the horizontal directions, as compared to both the sidewalls of the first stack structure $120a_1$ and the sidewalls of the second stack structure $120a_2$. The dielectric film structure 132 and the channel 134 are positioned conformally along the profile of the outer surface of the channel structure 130, where the channel burying film pattern 136 fills the interior of the channel 134. In detail, the channel structure 130 may have at least one cross-like sectional shape in the z-axis direction.

Referring to FIG. 7B, a case where a recessed sidewall of the first inter-structure layer 150b and an unrecessed sidewall of the first inter-structure layer 150b are next to each other is shown. However, the inventive concept is not limited thereto. Locations and ratios of the recessed sidewalls of the first inter-structure layer 150b and the unrecessed sidewalls of the first inter-structure layer 150b may vary. For example, a ratio between the recessed sidewalls of the first inter-structure layer 150b and the unrecessed sidewalls of the first inter-structure layer 150b may be 1:2, 2:1, 3:1, or one of various other arbitrary ratios.

Figure 7C:
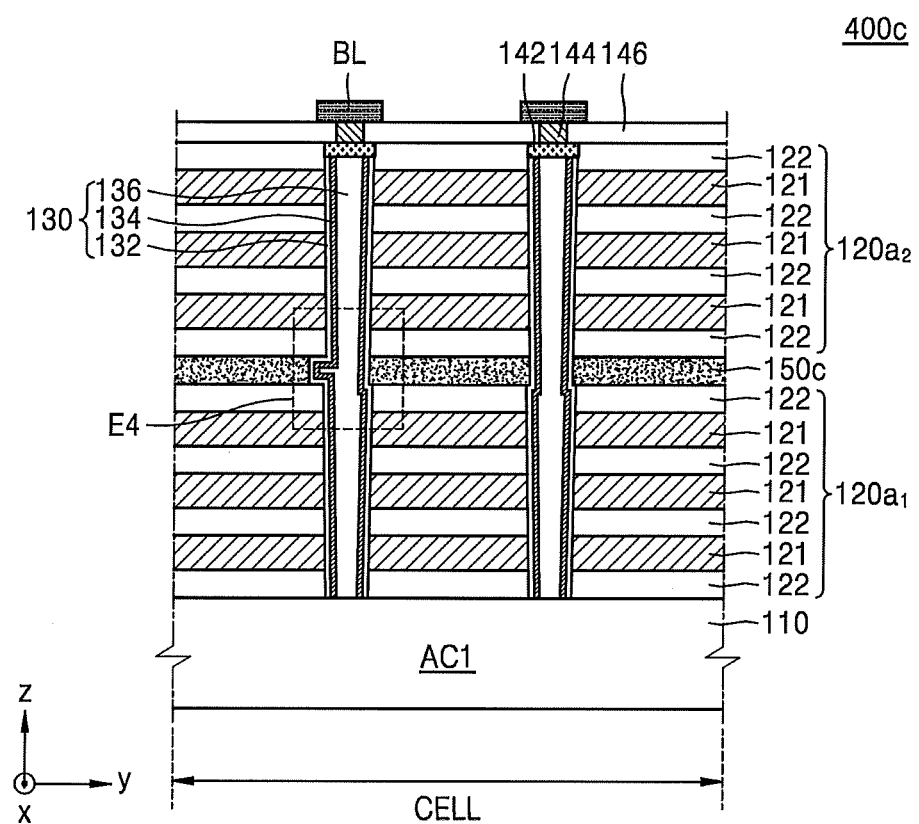
Figure 8C:
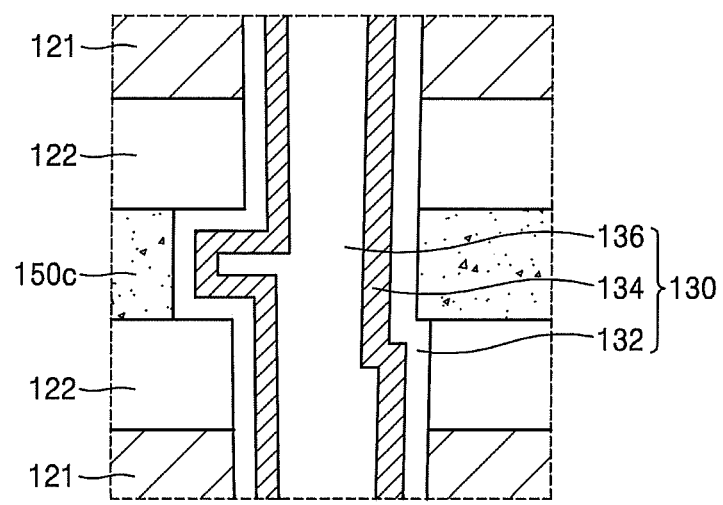

FIG. 7C is a sectional diagram for describing a vertical memory device 400c according to an embodiment of the inventive concept. FIG. 8C is a sectional diagram showing region E4 of FIG. 7C in further detail to describe the vertical memory device 400c of FIG. 7C.

Hereinafter, for convenience of explanation, only those features that are different from those illustrated above with respect to FIGS. 7A and 8A are provided.

Referring to FIGS. 7C and 8C, a first inter-structure layer 150c, the first stack structure $120a_1$, and the second stack structure $120a_2$ are penetrated by the channel structures 130, thereby forming sidewalls of the first inter-structure layer 150c, sidewalls of the first stack structure $120a_1$, and sidewalls of the second stack structure $120a2$. The sidewalls of the first inter-structure layer 150c may be further recessed in the horizontal directions, as compared to at least one of the sidewalls of the first stack structure $120a_1$ and the sidewalls of the second stack structure $120a_2$. In detail, at least one of the sidewalls of the first inter-structure layer 150c may be partially recessed, and thus, in this embodiment the first inter-structure layer 150c may have an asymmetrical shape, as shown.

Figure 9:
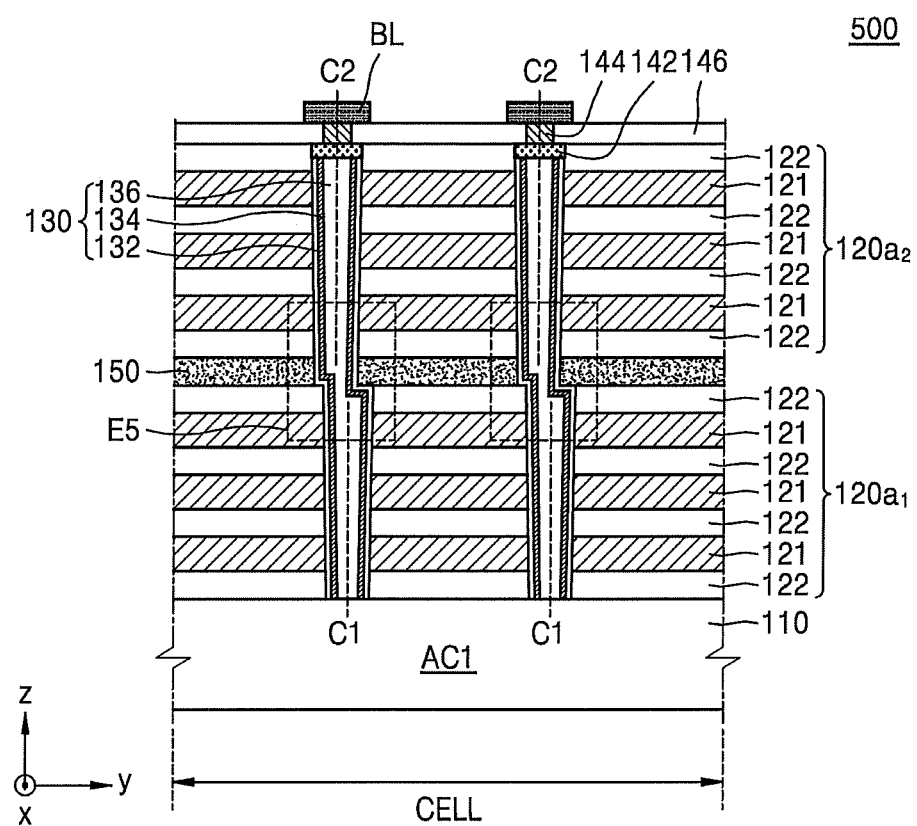
FIG. 9 is a sectional diagram for describing a vertical memory device according to an embodiment of the inventive concepts.
Figure 10:
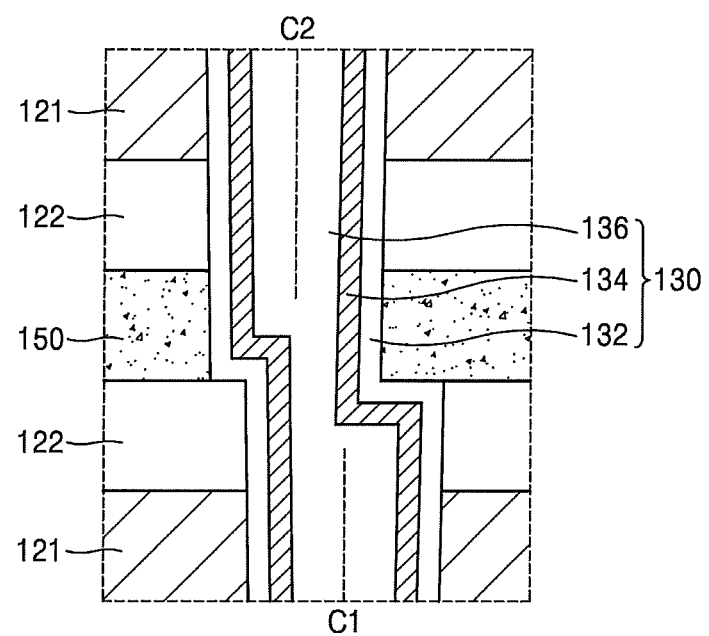
FIG. 10 is a sectional diagram showing a portion of FIG. 9 in detail to describe a vertical memory device according to an embodiment of the inventive concepts.

FIG. 9 is a sectional diagram for describing a vertical memory device 500 according to an embodiment of the inventive concept. FIG. 10 is a sectional diagram showing region E5 of FIG. 9 in further detail to describe the vertical memory device 500 of FIG. 9.

Hereinafter, for convenience of explanation, only those features that are different from those illustrated above with respect to FIGS. 2 through 4 are provided.

Referring to FIGS. 9 and 10, a portion of the channel structure 130 formed at a same level as the first stack structure $120a_1$ may be referred to as a first portion, whereas a portion of the channel structure 130 formed at a same level as the second stack structure $120a_2$ may be referred to as a second portion.

According to some embodiments, the first portion and the second portion may be misaligned with each other in the horizontal direction. In detail, a first center axis C1 of the first portion parallel to the first direction (z-axis direction) and a second center axis C2 of the second portion parallel to the first direction (z-axis direction) are not along the same straight line.

Although not shown, the sidewalls of the first inter-structure layer 150 may be further recessed in the horizontal directions to extend in an outward horizontal direction, as compared to at least one of the sidewalls of the first stack structure $120a_1$ and the sidewalls of the second stack structure $120a2$.

Figure 11A:
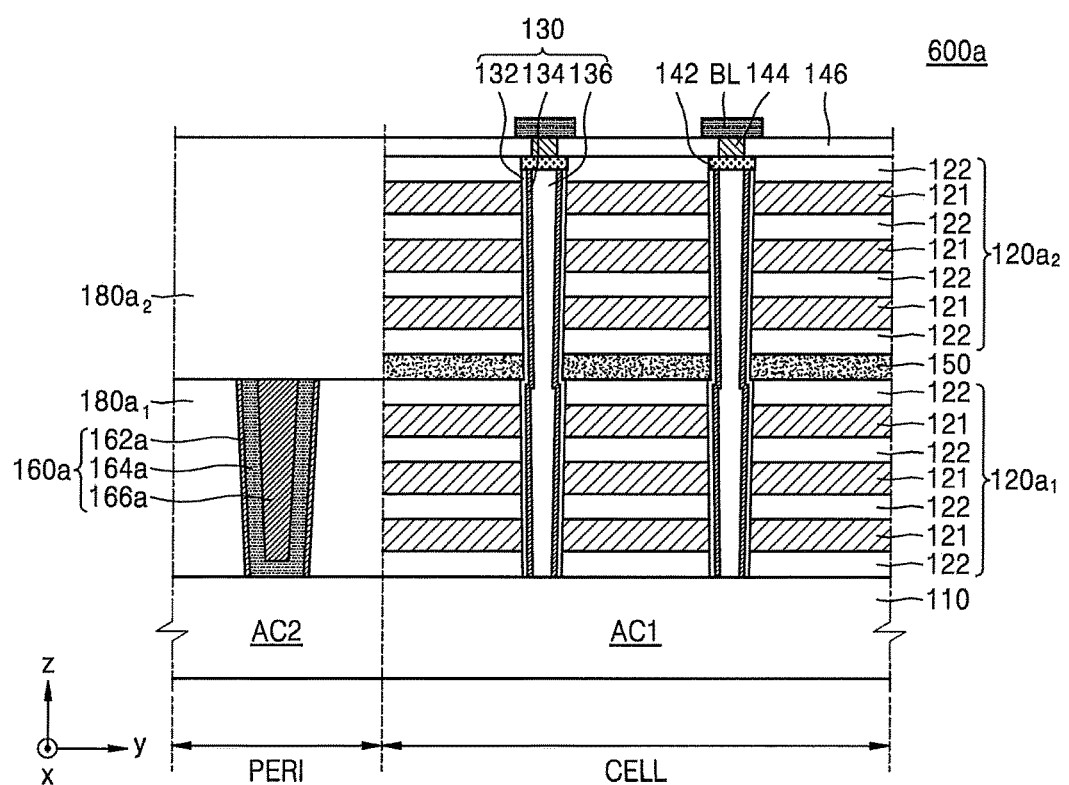
FIGS. 11A through 11C are sectional diagrams for describing a vertical memory device according to an embodiment of the inventive concepts.

FIG. 11A is a sectional diagram for describing a vertical memory device 600a according to an embodiment of the inventive concepts.

Hereinafter, for convenience of explanation, only those features that are different from those illustrated above with respect to FIGS. 2 through 4 are provided.

Referring to FIG. 11A, an alignment key 160a may be formed in the peripheral circuit region PERI of the vertical memory device 600a. The alignment key 160a may include a key inner film 164a, a key outer film 162a surrounding the outer wall of the key inner film 164a, and a key filler 166a that fills the interior of the key inner film 164a.

According to embodiments, the outer wall of the key outer film 162a may be surrounded by a first filling oxide $180a_1$. In some embodiments, the key outer film 162a may include polycrystalline silicon. Alternatively, the key outer film 162a may include a nitride-based material, such as silicon nitride (SiN) or silicon boron nitride (SiBN).

The key inner film 164a is disposed in the peripheral circuit region PERI and may contact the top surface of the substrate 110. The key inner film 164a may have a hollow circular truncated cone-like shape having the height axis extending in the first direction (z-axis direction). A smaller one of bottom surfaces of circular portions of the circular truncated cone is disposed closer to the substrate 110. The key inner film 164a may include polycrystalline silicon. Alternatively, the key inner film 164a may include a nitride-based material, such as silicon nitride (SiN) or silicon boron nitride (SiBN).

The key filler 166a may be disposed inside the key inner film 164a. The key filler 166a may have a solid circular truncated cone-like shape having the height axis extending in the first direction (z-axis direction), where a smaller one of bottom surfaces of circular portions of the circular truncated cone is disposed more proximal to the substrate 110. The key filler 166a may include polycrystalline silicon. Alternatively, the key filler 166a may include a nitride-based material, such as silicon nitride (SiN) or silicon boron nitride (SiBN).

According to embodiments, the composition of the key outer film 162a may be different from the composition of the key inner film 164a, whereas the composition of the key inner film 164a may be different from the composition of the key filler 166a.

In some embodiments, the composition of the key outer film 162a may be identical to the composition of the key filler 166a, whereas the composition of the key outer film 162a may be different from the composition of the key filler 166a. In detail, the key outer film 162a and the key filler 166a may include polycrystalline silicon, whereas the key inner film 164a may include a nitride-based material, such as silicon nitride (SiN) or silicon boron nitride (SiBN). In detail, the key outer film 162a and the key filler 166a may include a nitride-based material, such as silicon nitride (SiN) or silicon boron nitride (SiBN), whereas the key inner film 164a may include polycrystalline silicon.

Figure 11B:
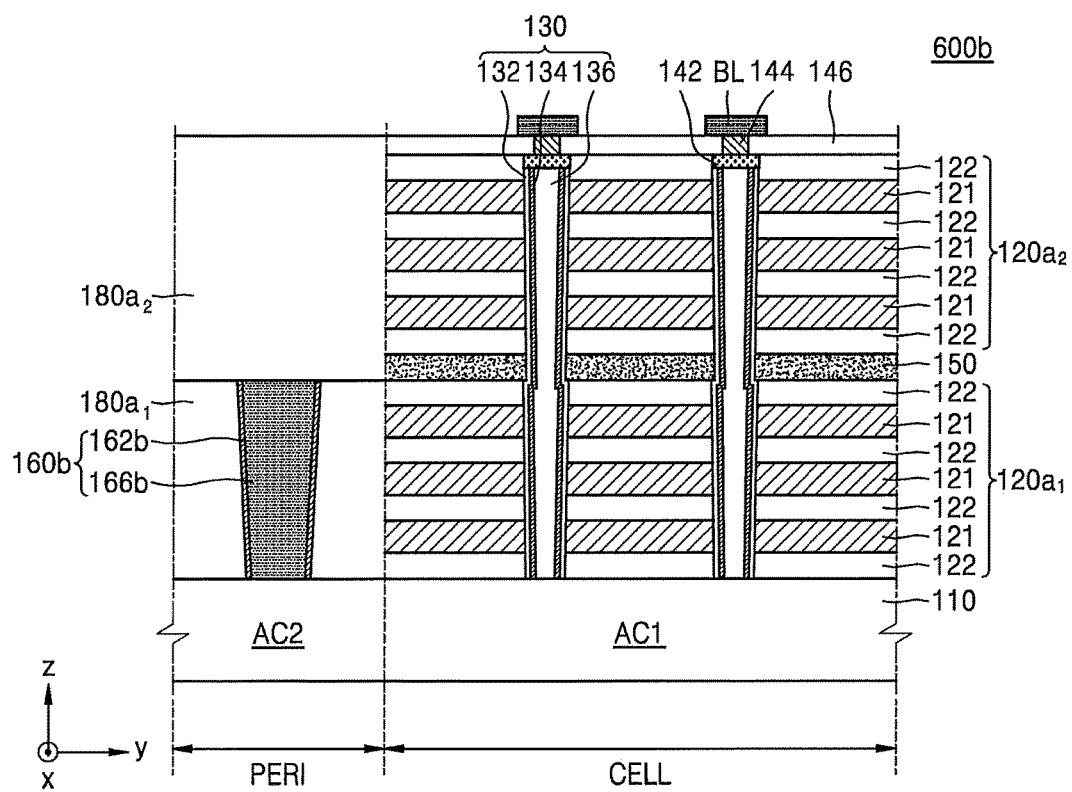

FIG. 11B is a sectional diagram for describing a vertical memory device 600b according to an embodiment of the inventive concepts.

Hereinafter, for convenience of explanation, only those features that are different from those illustrated above with respect to FIG. 11A are provided.

Referring to FIG. 11B, an alignment key 160b may be formed in the peripheral circuit region PERI of the vertical memory device 600b. The alignment key 160b may include a key outer film 162b and a key filler 166b.

According to embodiments, the outer wall of the key outer film 162b may be surrounded by the first filling oxide $180a_1$. The key outer film 162b may include polycrystalline silicon. Alternatively, the key outer film 162b may include a nitride-based material, such as silicon nitride (SiN) or silicon boron nitride (SiBN).

The key filler 166b may be disposed inside the key outer film 162b. The key filler 166b may have a solid circular truncated cone-like shape having the height axis extending in the first direction (z-axis direction), where a smaller one of bottom surfaces of circular portions of the circular truncated cone is disposed more proximal to the substrate 110. The key filler 166b may include polycrystalline silicon. Alternatively, the key filler 166b may include a nitride-based material, such as silicon nitride (SiN) or silicon boron nitride (SiBN).

According to embodiments, the composition of the key outer film 162b may be different from the composition of the key filler 166b. In detail, the key outer film 162b may include polycrystalline silicon, whereas the key filler 166b may include a nitride-based material, such as silicon nitride (SiN) or silicon boron nitride (SiBN). In detail, the key outer film 162b may include a nitride-based material, such as silicon nitride (SiN) or silicon boron nitride (SiBN), whereas the key filler 166b may include polycrystalline silicon.

Figure 11C:
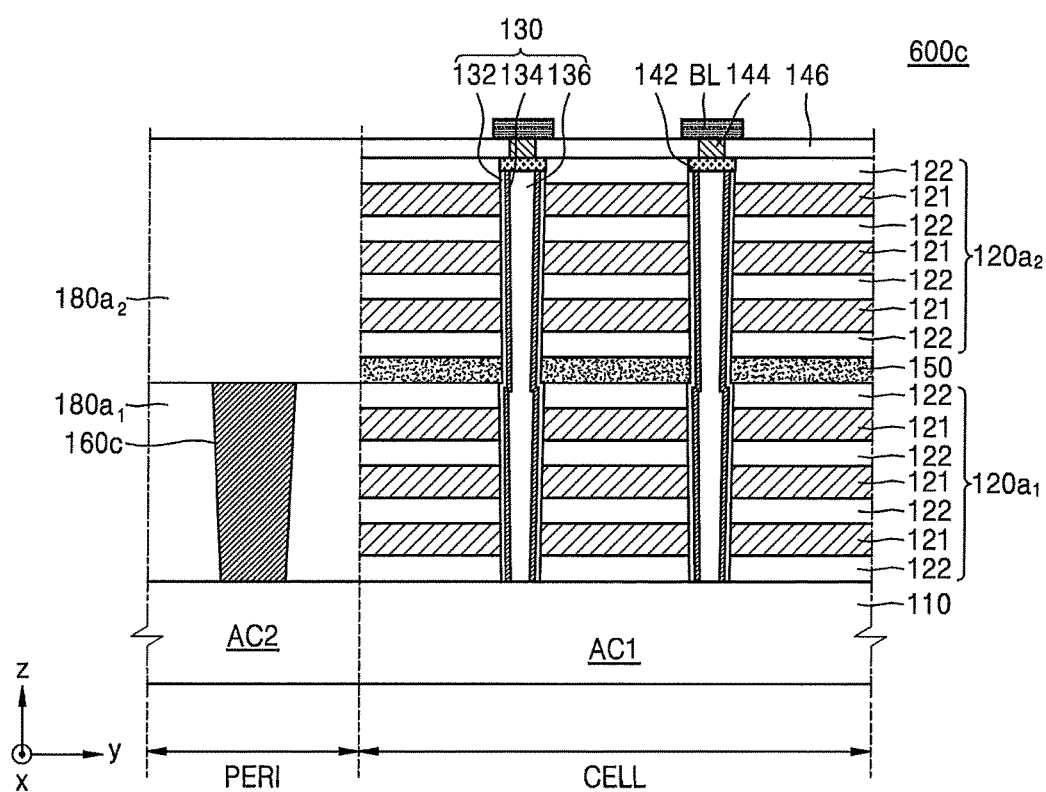

FIG. 11C is a sectional diagram for describing a vertical memory device 600c according to an embodiment of the inventive concepts.

Hereinafter, only those features that are different from those illustrated above with respect to FIG. 11A will be described.

Referring to FIG. 11C, an alignment key 160c may be formed in the peripheral circuit region PERI of the vertical memory device 600c. The alignment key 160c may have a solid circular truncated cone-like shape having the height axis extending in the first direction (z-axis direction), where a smaller one of bottom surfaces of circular portions of the circular truncated cone is disposed closer to the substrate 110. The alignment key 160c may include polycrystalline silicon. Alternatively, the alignment key 160c may include a nitride-based material, such as silicon nitride (SiN) or silicon boron nitride (SiBN).

Figure 12:
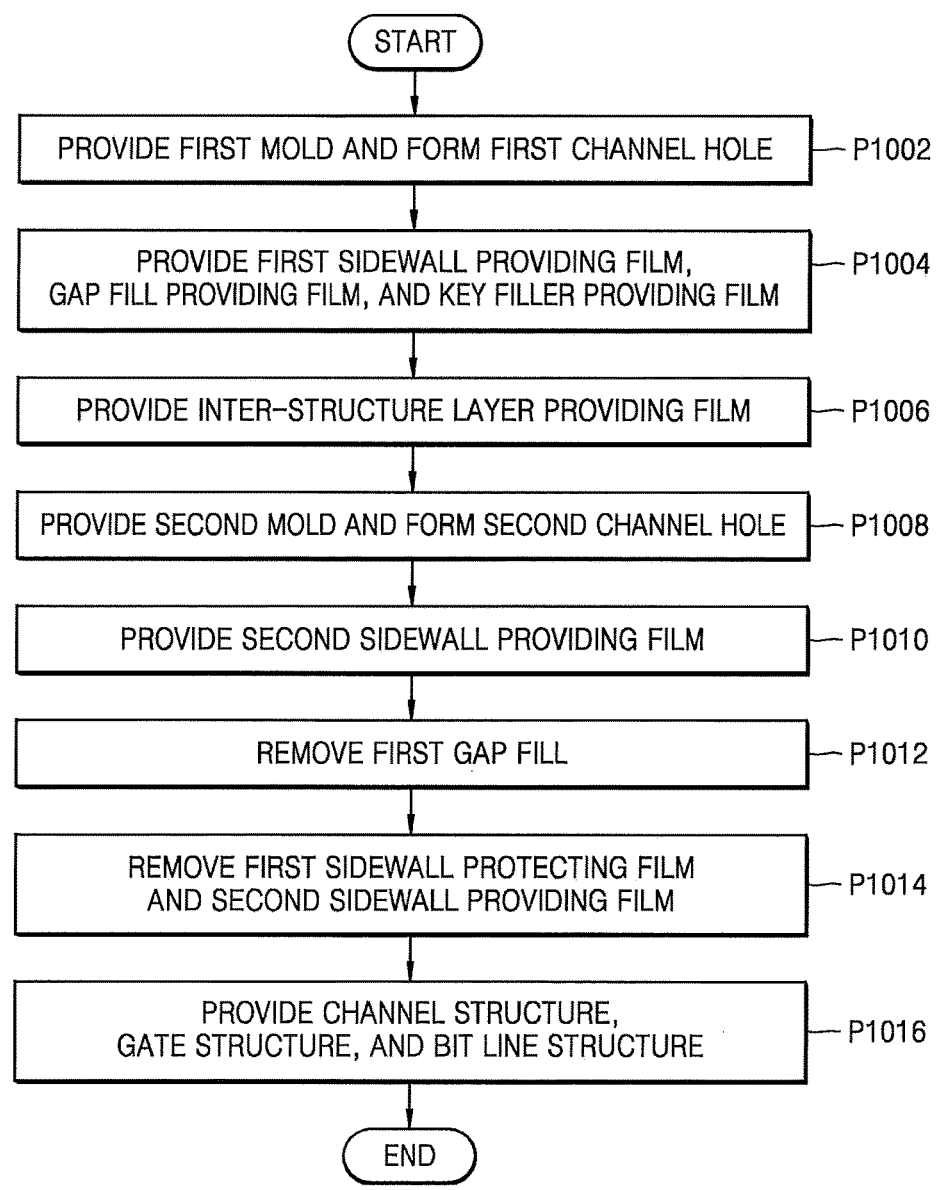
FIG. 12 is a flowchart showing a process of fabricating of a vertical memory device, according to an embodiment of the inventive concepts.

FIG. 12 is a flowchart showing a process of fabricating a vertical memory device according to an embodiment of the inventive concepts.

FIGS. 13 through 28 are diagrams for describing fabrication of vertical memory devices, according to some embodiments of the inventive concepts.

Figure 13:
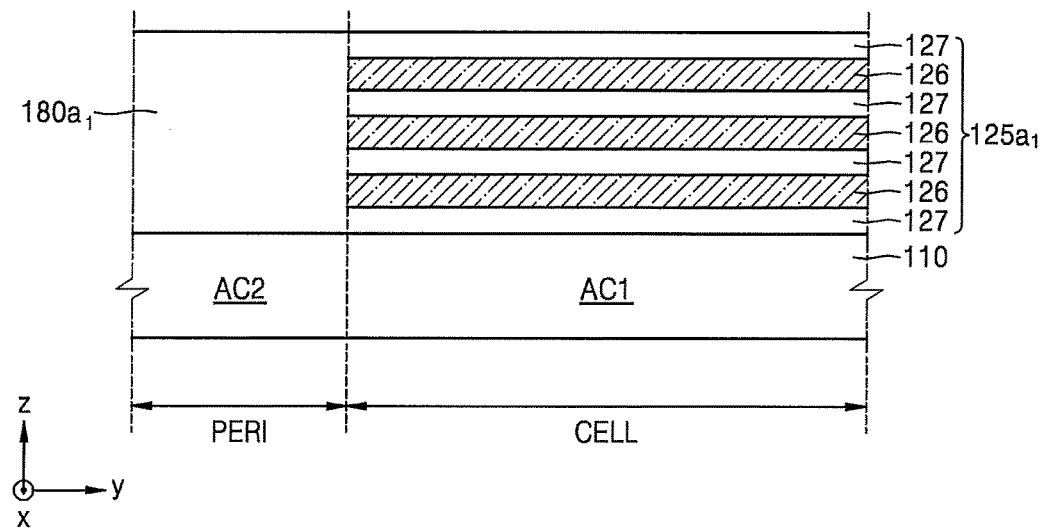
FIGS. 13 through 29 sectional diagrams for describing vertical memory devices according to an embodiment of the inventive concepts.

Referring to FIGS. 12 and 13, in operation P1002, a substrate 110 having defined thereon a cell array region CELL and a peripheral circuit region PERI may be provided. The substrate 110 includes a device isolating region (not shown) that defines an active region. The active region may include a first active region AC1 defined in the cell array region CELL and a second active region AC2 defined in the peripheral circuit region PERI.

A first mold $125a_1$ including sacrificing films 126 and insulation films 127 that are alternately and repeatedly stacked on the first active region AC1 in the first direction (z-axis direction) and are parallel to the top surface of the substrate 110 may be provided. A first filling oxide $180a_1$ may be provided on the second active region AC2 at a same level as the first mold $125a_1$.

In some embodiments, the insulation films 127 may include an oxide-based material, such as silicon oxide (SiO$_2$), silicon oxycarbide (SiOC), or silicon oxyfluoride (SiOF). In some embodiments, the sacrificing films 126 may include polycrystalline silicon. Alternatively, the sacrificing films 126 may include a nitride-based material, such as silicon nitride (SiN) or silicon boron nitride (SiBN).

The first filling oxide $180a_1$ may include an oxide-based material, such as silicon oxide ($SiO_2$), silicon oxycarbide (SiOC), or silicon oxyfluoride (SiOF).

Figure 14:
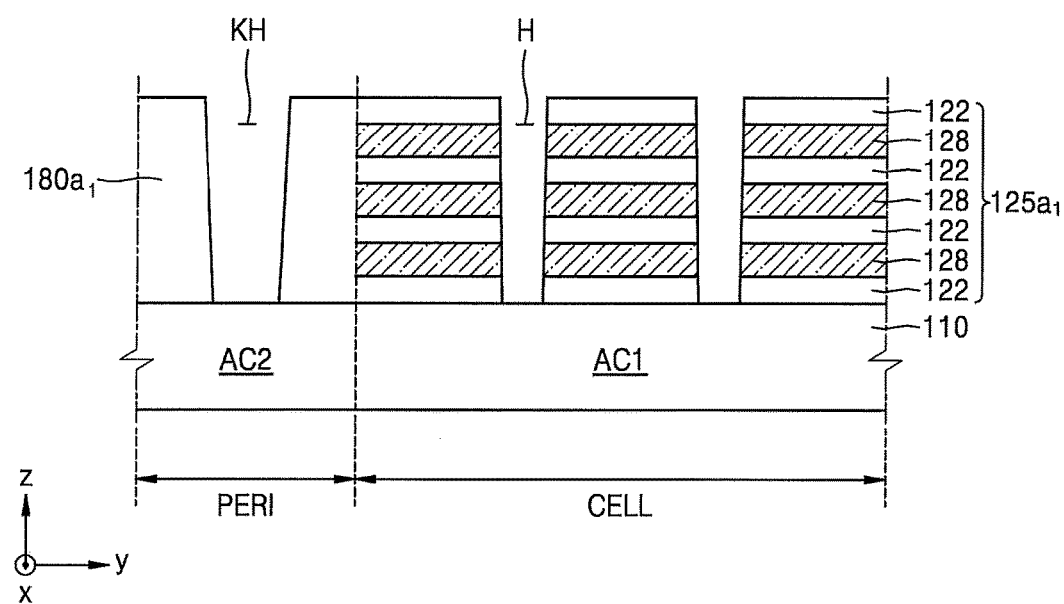

Referring to FIGS. 12 and 14, in operation P1002, a plurality of first channel holes H1 that extend in the first direction (z-axis direction) and are apart from one another in the second direction (x-axis direction) or the third direction (y-axis direction) may be formed in the first mold $125a_1$ on the cell array region CELL. The first channel holes H1 may penetrate through the first mold $125a_1$ and expose portions of the cell array region CELL of the substrate 110. A key hole KH extending in the first direction (z-axis direction) may be formed in the peripheral circuit region PERI. The key hole KH may expose a portion of the peripheral circuit region PERI of the substrate 110.

According to some embodiments, the first channel holes H1 may be formed by forming a hard mask (not shown) on the first mold $125a_1$ on the cell array region CELL and etching the insulation films 127 and the sacrificing films 126 of the first mold $125a_1$ in a dry etching operation using the hard mask as an etching mask. Therefore, the insulation films 127 may be patterned to insulation film patterns 122, whereas the sacrificing films 126 may be patterned to form sacrificing film patterns 128. The top surface of the substrate 110 may be exposed by the first channel holes H1. The hard mask may include a silicon-based or carbon-based spin on hard mask (SOH) material or a photoresist material, for example.

According to some embodiments, the key hole KH may be formed by forming a hard mask (not shown) on the first filling oxide $180a_1$ on the peripheral circuit region PERI and etching first filling oxide $180a_1$ in a dry etching operation using the hard mask as an etching mask. After the key hole KH is formed, the top surface of the substrate 110 may be exposed by the key hole KH. The hard mask may include a silicon-based or carbon-based spin on hard mask (SOH) material or a photoresist material, for example.

Figure 15:
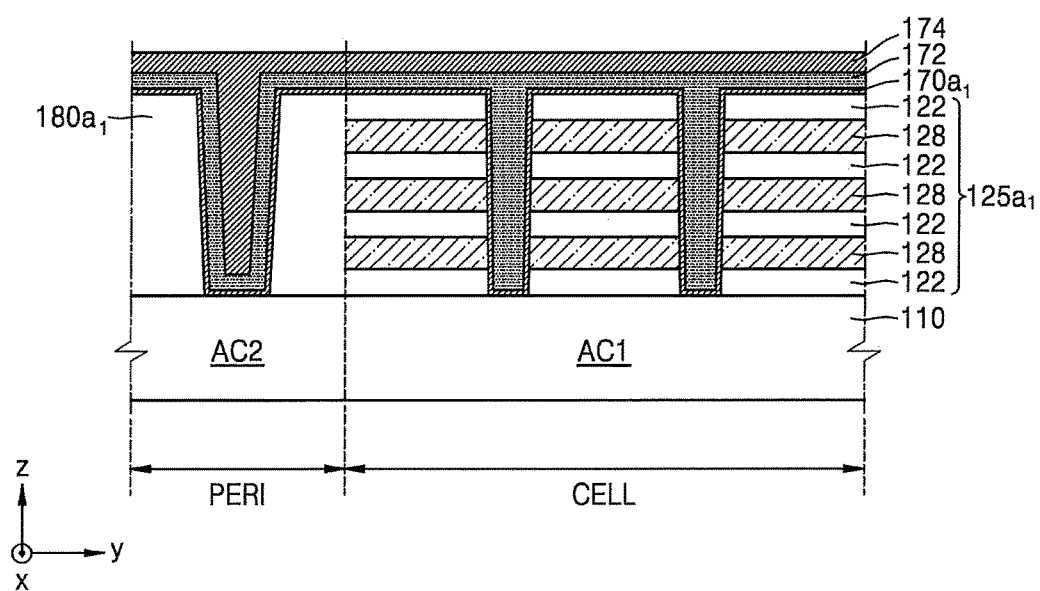

Referring to FIGS. 12 and 15, in operation P1004, a first sidewall providing film $170a_1$, a gap fill providing film 172, and a key filler providing film 174 may be provided.

The first sidewall providing film $170a_1$ may be conformally provided on the top surface of the first mold $125a_1$, the key hole KH, and the first channel holes H1. The first sidewall providing film $170a_1$ may include polycrystalline silicon. Alternatively, the first sidewall providing film $170a_1$ may include a nitride-based material, such as silicon nitride (SiN) or silicon boron nitride (SiBN). The first sidewall providing film $170a_1$ may be formed in one of various operations including an atomic layer deposition and a chemical vapour deposition.

The gap fill providing film 172 may be conformally provided on the first sidewall providing film $170a_1$. In some embodiments, the gap fill providing film 172 may be provided to slightly fill the first channel holes H1. The gap fill providing film 172 may include polycrystalline silicon. Alternatively, the gap fill providing film 172 may include a nitride-based material, such as silicon nitride (SiN) or silicon boron nitride (SiBN). The gap fill providing film 172 may be formed in one of various operations including an atomic layer deposition and a chemical vapour deposition.

The key filler providing film 174 may be formed on the gap fill providing film 172. In some embodiments, the key filler providing film 174 may be provided to slightly fill the key hole KH. The key filler providing film 174 may include polycrystalline silicon. Alternatively, the key filler providing film 174 may include a nitride-based material, such as silicon nitride (SiN) or silicon boron nitride (SiBN). The key filler providing film 174 may be formed in one of various operations including an atomic layer deposition and a chemical vapour deposition.

According to embodiments, the first sidewall providing film $170a_1$ may comprise a material that exhibits high etching selectivity with respect to the material of the gap fill providing film 172 and the sacrificing film patterns 128. Alternatively, the gap fill providing film 172 and the sacrificing film patterns 128 may comprise a material that exhibits high etching selectivity with respect to the key filler providing film 174. In some embodiments, the first sidewall providing film $170a_1$ and the key filler providing film 174 may comprise a material that exhibits high etching selectivity with respect to the sacrificing film patterns 128 and the gap fill providing film 172. In detail, the first sidewall providing film $170a_1$ and the key filler providing film 174 may include polycrystalline silicon, whereas the gap fill providing film 172 and the sacrificing film patterns 128 may include a nitride-based material, such as silicon nitride (SiN) or silicon boron nitride (SiBN). Alternatively, the first sidewall providing film $170a_1$ and the key filler providing film 174 may include a nitride-based material, such as silicon nitride (SiN) or silicon boron nitride (SiBN), whereas the sacrificing film patterns 128 and the gap fill providing film 172 may include polycrystalline silicon.

Figure 16:
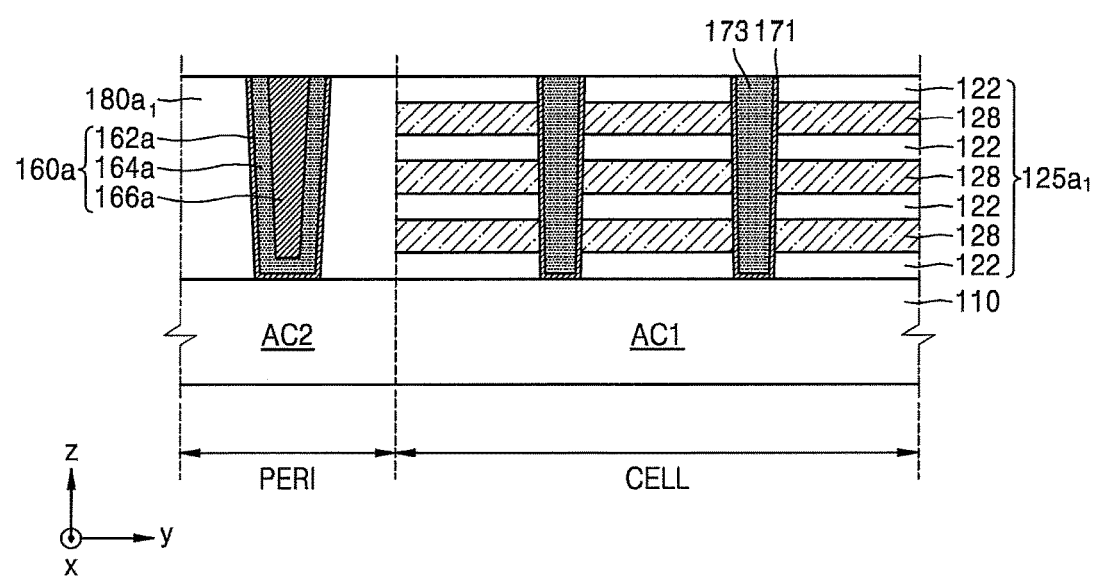

Referring to FIGS. 12 and 16, the first sidewall providing film $170a_1$, the gap fill providing film 172, and the key filler providing film 174 may be planarized until the uppermost insulation film pattern 122 is exposed. Therefore, the alignment key 160a including the key outer film 162a conformally disposed on the bottom and the sidewalls of the key hole KH, the key inner film 164a conformally disposed on the key outer film 162a, and the key filler 166a disposed inside the key inner film 164a may be formed in the peripheral circuit region PERI. A first sidewall protecting film 171 conformally disposed on the bottom and the sidewalls of the first channel hole H1 and a gap fill 173 disposed inside the first sidewall protecting film 171 may be formed in the cell array region CELL. The planarizing operation may include a chemical mechanical polishing (CMP) operation and/or an etch-back operation.

Figure 17:
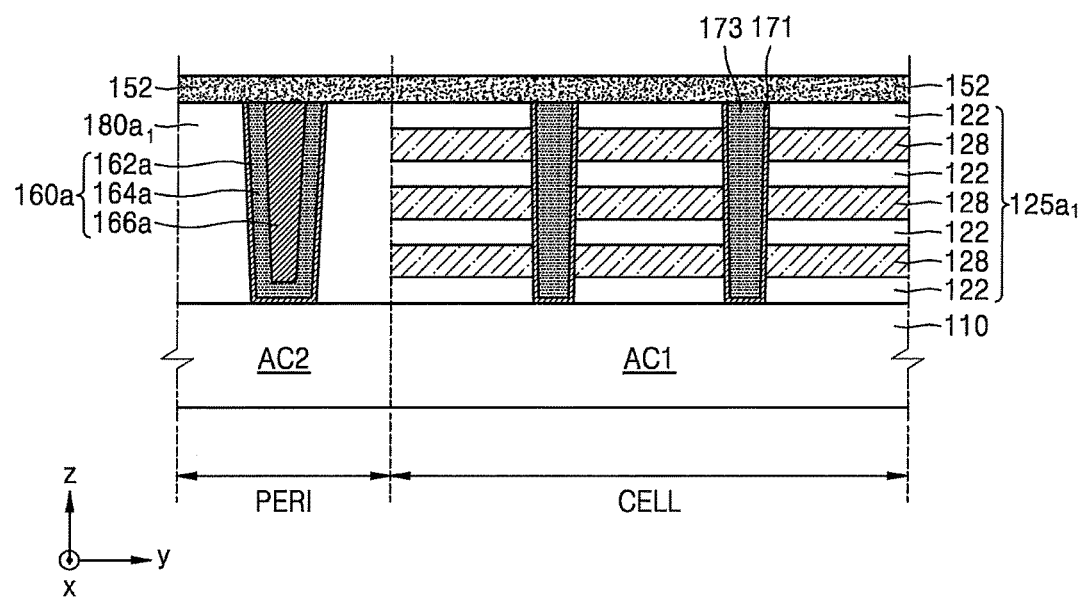

Referring to FIGS. 12 and 17, in operation P1006, a first inter-structure layer providing film 152 may be formed on the first mold $125a_1$ and the first filling oxide $180a_1$. According to embodiments, the top surface of the alignment key 160a, the top surface of the first sidewall protecting film 171, and the top surface of the gap fill 173 may contact the first inter-structure layer providing film 152.

In some embodiments, the first inter-structure layer providing film 152 may include polycrystalline silicon. Alternatively, the first inter-structure layer providing film 152 may include a nitride-based material, such as silicon nitride (SiN) or silicon boron nitride (SiBN). The first inter-structure layer providing film 152 may be formed in one of various operations including an atomic layer deposition and a chemical vapour deposition.

According to embodiments, the material of the first inter-structure layer providing film 152 may exhibit high etching selectivity with respect to the gap fill 173 and the sacrificing film patterns 128. In some embodiments, the material of the first inter-structure layer providing film 152 may exhibit high etching selectivity with respect to the sacrificing film patterns 128 and the gap fill 173. In detail, the first inter-structure layer providing film 152 may include polycrystalline silicon, whereas the sacrificing film patterns 128 and the gap fill 173 may include a nitride-based material, such as silicon nitride (SiN) or silicon boron nitride (SiBN). Alternatively, the first inter-structure layer providing film 152 may include a nitride-based material, such as silicon nitride (SiN) or silicon boron nitride (SiBN), whereas the sacrificing film patterns 128 and the gap fill 173 may include polycrystalline silicon.

Figure 18:
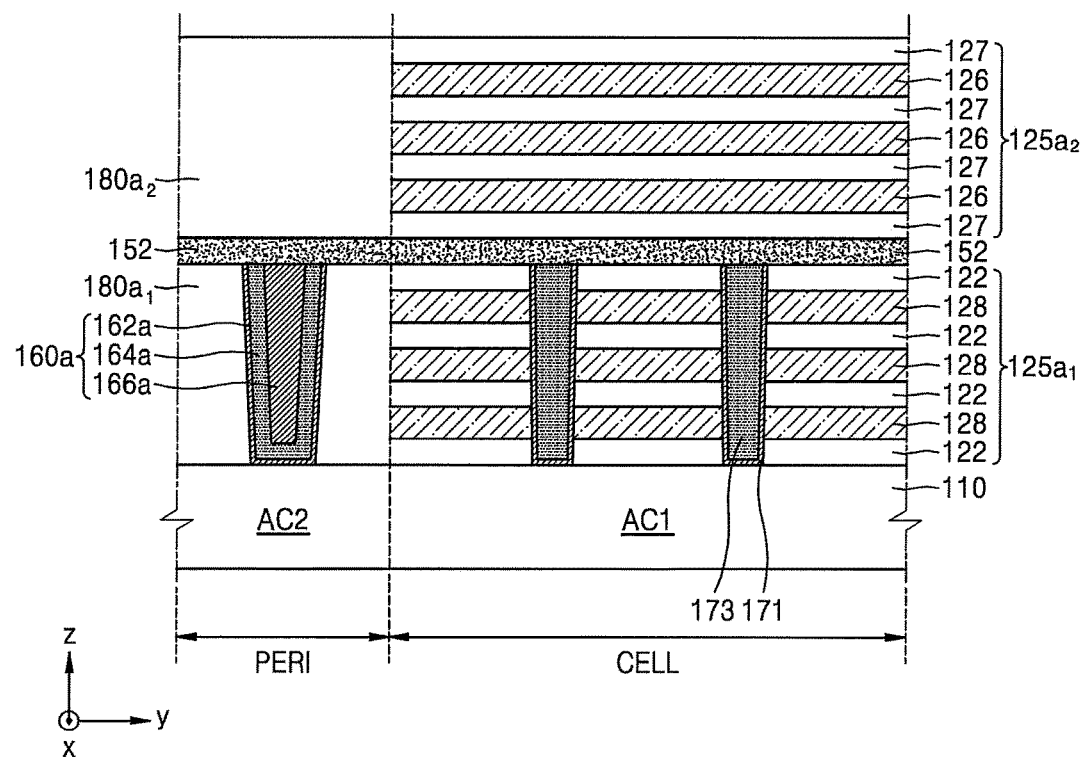

Referring to FIGS. 12 and 18, in operation P1008, a second mold 125$a_2$ including the sacrificing films 126 and the insulation films 127 that are alternately and repeatedly stacked on the first inter-structure layer providing film 152 in the first active region AC1 in the first direction (z-axis direction) and are parallel to the top surface of the substrate 110 may be provided. A second filling oxide 180$a_2$ may be provided on the first inter-structure layer providing film 152 in the second active region AC2 at a same level as the second mold 125$a_2$.

In some embodiments, the insulation films 127 may include an oxide-based material, such as silicon oxide (SiO$_2$), silicon oxycarbide (SiOC), or silicon oxyfluoride (SiOF). The sacrificing films 126 may include polycrystalline silicon. Alternatively, the sacrificing films 126 may include a nitride-based material, such as silicon nitride (SiN) or silicon boron nitride (SiBN).

The second filling oxide 180$a_2$ may include an oxide-based material, such as silicon oxide (SiO$_2$), silicon oxycarbide (SiOC), or silicon oxyfluoride (SiOF).

Figure 19:
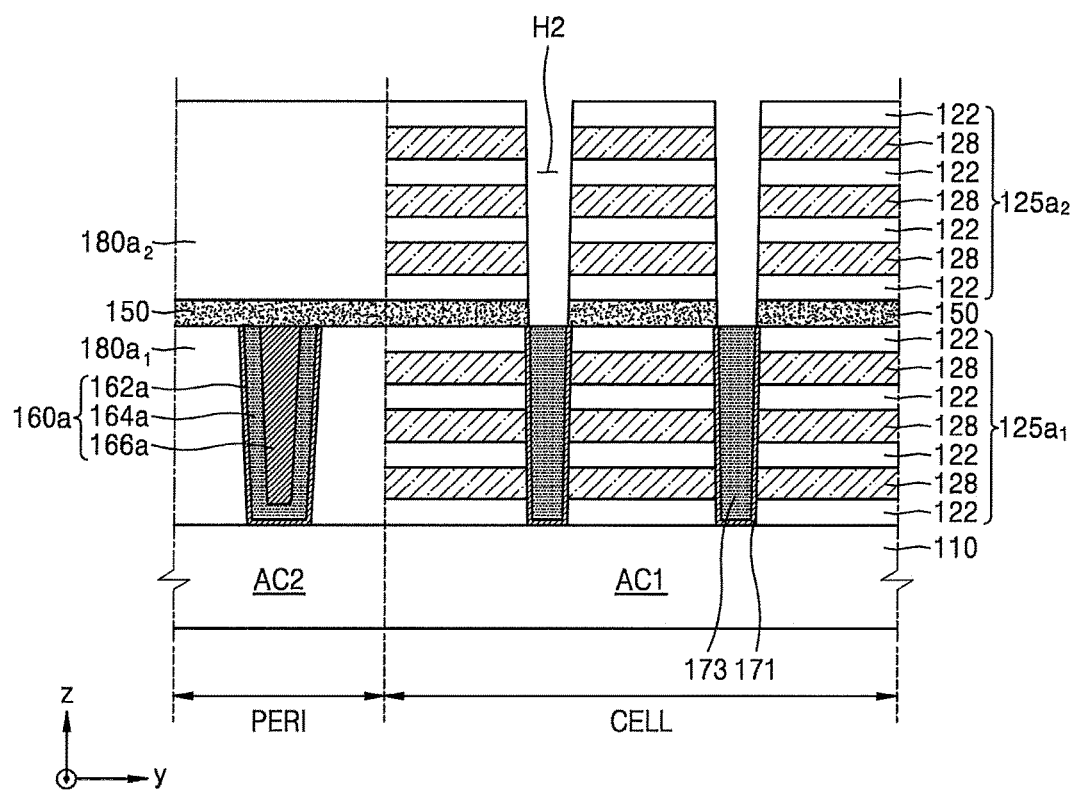

Referring to FIGS. 12 and 19, in operation P1008, a plurality of second channel holes H2 that extend in the first direction (z-axis direction) and are apart from one another in the second direction (x-axis direction) or the third direction (y-axis direction) may be formed in the second mold 125$a_2$ on the cell array region CELL. The second channel holes H2 may penetrate through the second mold 125$a_2$ and expose the top surface of the gap fill 173.

According to embodiments, the second channel holes H2 may be formed by forming a hard mask (not shown) on the second mold 125$a_2$ on the cell array region CELL and etching the insulation films 127 and the sacrificing films 126 of the second mold 125$a_2$ in a dry etching operation using the hard mask as an etching mask. In some embodiments, the first inter-structure layer providing film 152 may also be etched in this process step. Therefore, the insulation films 127 may be patterned to the insulation film patterns 122, the sacrificing films 126 may be patterned to form sacrificing film patterns 128, and the first inter-structure layer providing film 152 may be patterned to form the first inter-structure layer 150. The hard mask may include a silicon-based or carbon-based spin on hard mask (SOH) material or a photoresist material, for example. Here, the alignment key 160a is transparent with respect to the first filling oxide 180$a_1$ and the second filling oxide 180$a_2$, and thus the second channel holes H2 may thus be aligned with the first channel holes H1.

According to embodiments, the key hole KH may be formed by forming a hard mask (not shown) on the first filling oxide 180$a_1$ on the peripheral circuit region PERI and etching first filling oxide 180$a_1$ in a dry etching operation using the hard mask as an etching mask. After the key hole KH is formed, the top surface of the substrate 110 may be exposed by the key hole KH. The hard mask may include a silicon-based or carbon-based spin on hard mask (SOH) material or a photoresist material, for example.

Figure 20:
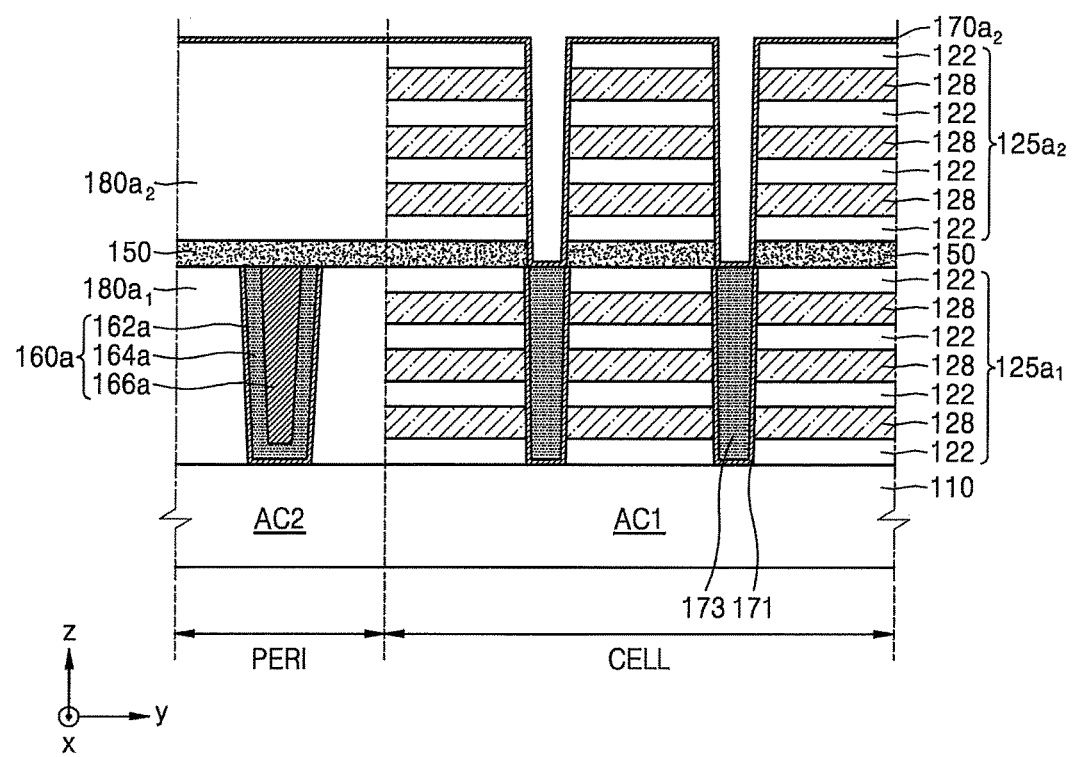

Referring to FIGS. 12 and 20, in operation P1010, a second sidewall providing film 170$a_2$ may be conformally provided on the second mold 125$a_2$, the second channel holes H2, and the second filling oxide 180$a$2. The second sidewall providing film 170$a_2$ may include polycrystalline silicon. Alternatively, the second sidewall providing film 170$a_2$ may include a nitride-based material, such as silicon nitride (SiN) or silicon boron nitride (SiBN). The second sidewall providing film 170$a_2$ may be formed in one of various operations including an atomic layer deposition and a chemical vapour deposition.

According to another embodiment, the second sidewall providing film 170$a_2$ may exhibit high etching selectivity with respect to the gap fill 173 and/or the sacrificing film patterns 128. In some embodiments, the second sidewall providing film 170$a_2$ may include a same composition as the first sidewall protecting film 171. In detail, the first sidewall protecting film 171 and the second sidewall providing film 170$a_2$ may include polycrystalline silicon, whereas the gap fill 173 and the sacrificing film patterns 128 may include a nitride-based material, such as silicon nitride (SiN) or silicon boron nitride (SiBN). Alternatively, the first sidewall protecting film 171 and the second sidewall providing film 170$a_2$ may include a nitride-based material, such as silicon nitride (SiN) or silicon boron nitride (SiBN), whereas the gap fill 173 and the sacrificing film patterns 128 may include polycrystalline silicon.

Figure 21:
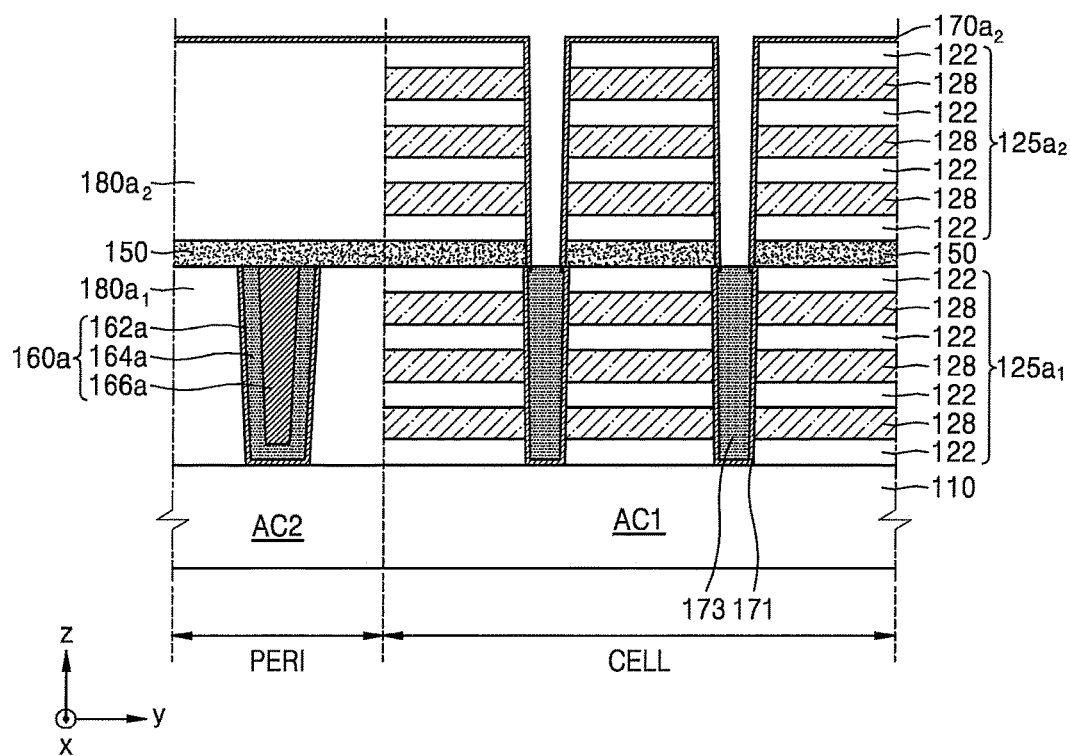

Referring to FIGS. 12 and 21, in operation P1012, at least a portion of the second sidewall providing film 170$a_2$ formed on the gap fill 173 may be dry-etched and removed. In some embodiments, a portion of the upper portion of the gap fill 173 may be removed together or the second sidewall providing film 170$a_2$ formed on the gap fill 173 may be selectively removed.

Figure 22:
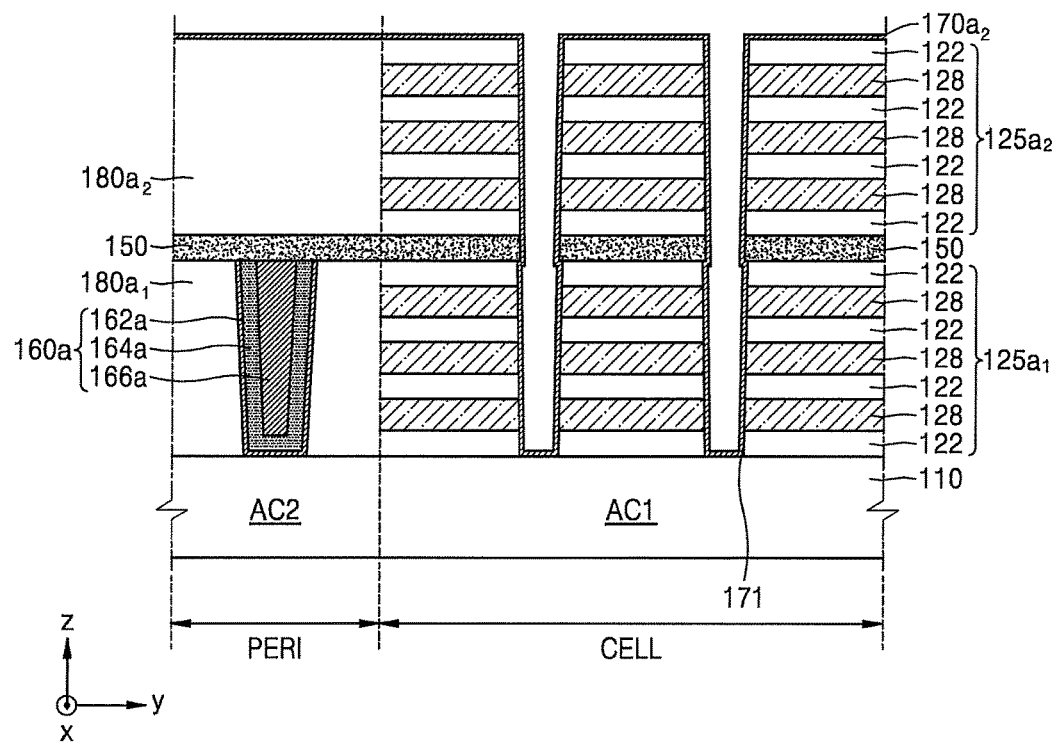

Referring to FIGS. 12 and 22, in operation P1012, the gap fill 173 may be removed, where a wet-etching operation may be performed therefor. If the gap fill 173 exhibits high etching selectivity with respect to the first sidewall protecting film 171 and the second sidewall providing film 170$a$2, the gap fill 173 may be selectively removed, thereby protecting the sacrificing film patterns 128.

Figure 23:
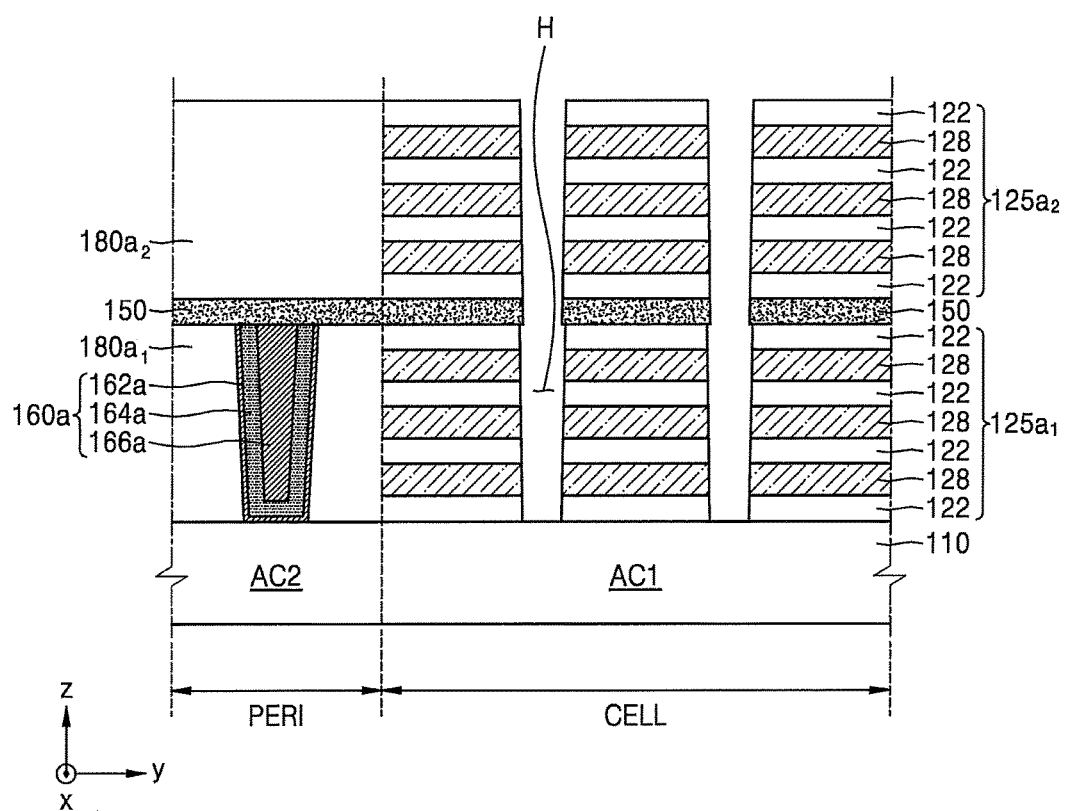

Referring to FIGS. 12 and 23, in operation P1014, the first sidewall protecting film 171 and the second sidewall providing film 170$a_2$ may be removed, where an wet-etching operation may be performed therefor. If the first sidewall protecting film 171 and the second sidewall providing film 170$a_2$ exhibit high etching selectivity with respect to the sacrificing film patterns 128, the first sidewall protecting film 171 and the second sidewall providing film 170$a_2$ may be selectively removed, thereby protecting the sacrificing film patterns 128. Therefore, channel holes H penetrating through the first mold 125$a_1$ and the second mold 125$a_2$ are formed.

Figure 24:
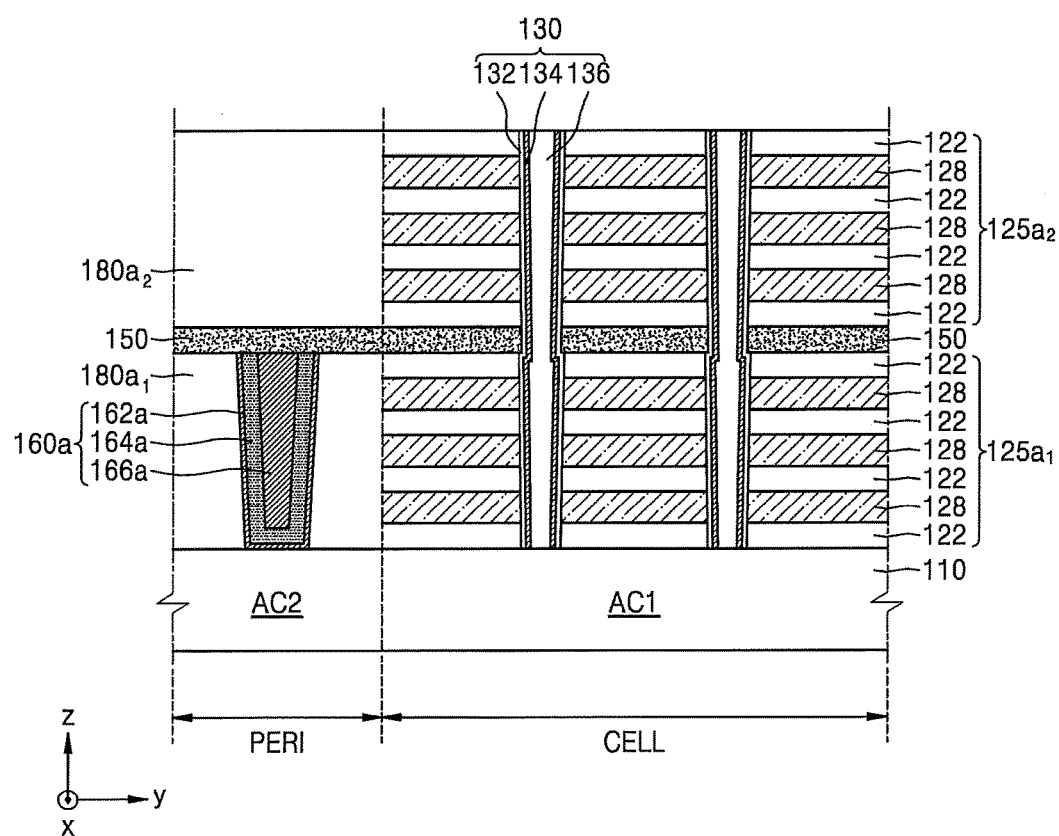

Referring to FIGS. 12 and 24, in operation P1016, a channel structure 130 including channels 134, dielectric film structures 132 surrounding the outer walls of the channels 134, and channel burying film patterns 136 disposed inside the channels 134 is provided. Although not shown, the channel structure 130 may be formed by conformally forming a dielectric film structure providing film, a channel providing film, and a burying film pattern providing film on the channel holes H and the second mold 125$a_2$ in the order stated and by etching the dielectric film structure providing film, the channel providing film, and the burying film pattern providing film to expose the uppermost insulation film patterns 122. The dielectric film structure providing film, the channel providing film, and the burying film pattern providing film may be formed in one of various operations including an atomic layer deposition and a chemical vapour deposition. The operation for etching the dielectric film structure providing film, the channel providing film, and the burying film pattern providing film may include a chemical mechanical polishing (CMP) operation and/or an etch-back operation.

It will be apparent to one of ordinary skill in the art, more particularly, the art related to vertical memory devices, that a vertical memory device including a plurality of stacked structures may be provided by repeatedly performing the operations described above with reference to FIGS. 13 through 24.

Since the operations shown in FIGS. 25 through 29 are performed in the cell array region CELL, FIGS. 25 through 29 only show structures in the cell array region CELL.

Figure 25:
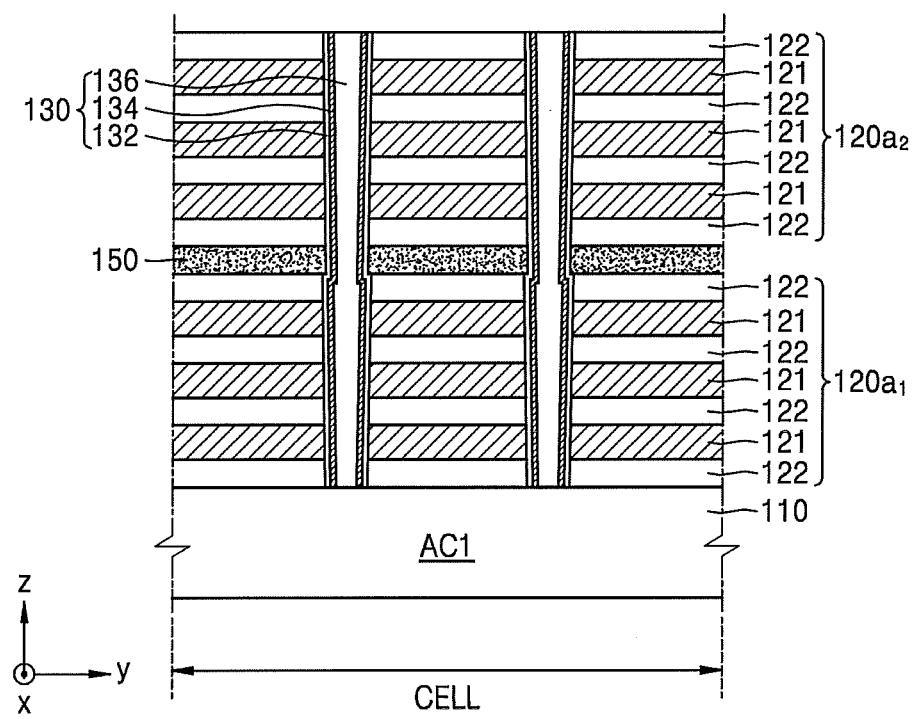
Figure 26:
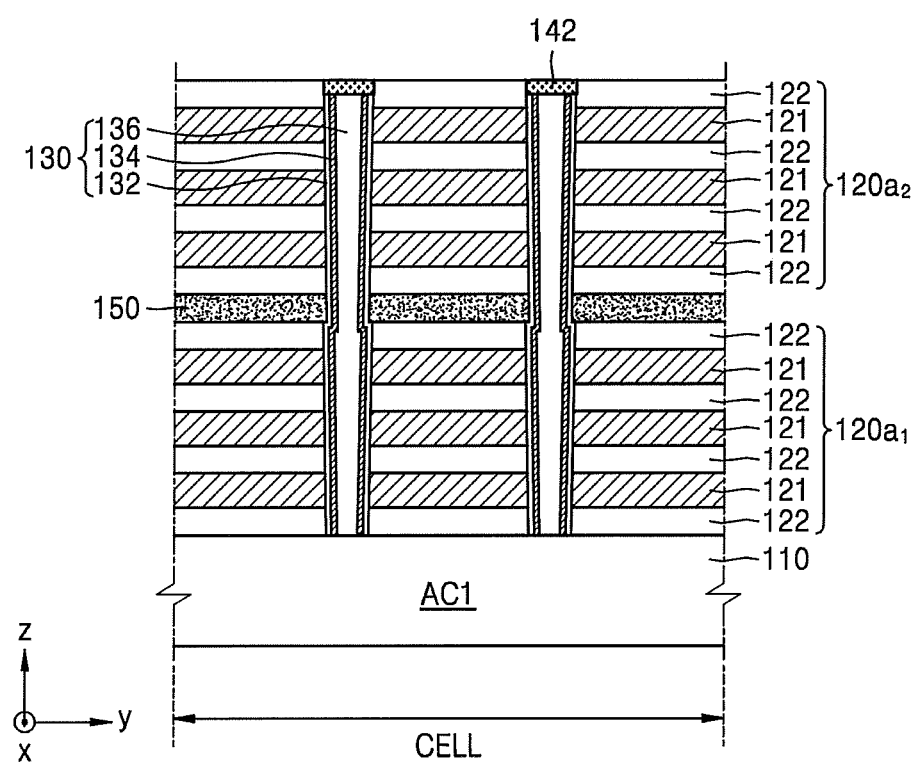
Figure 27:
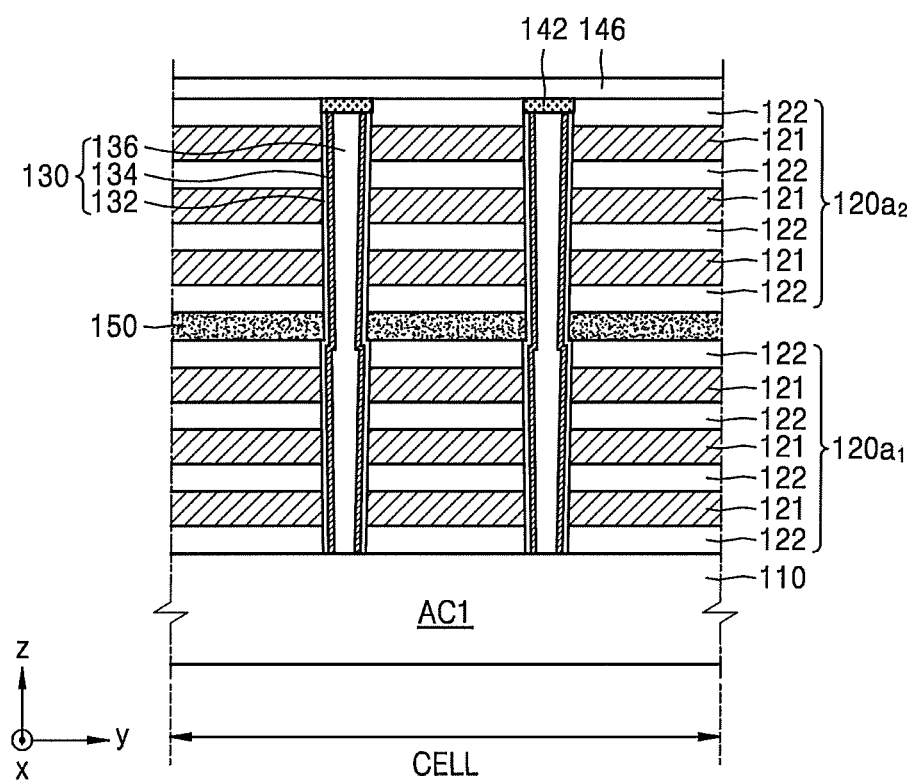
Figure 28:
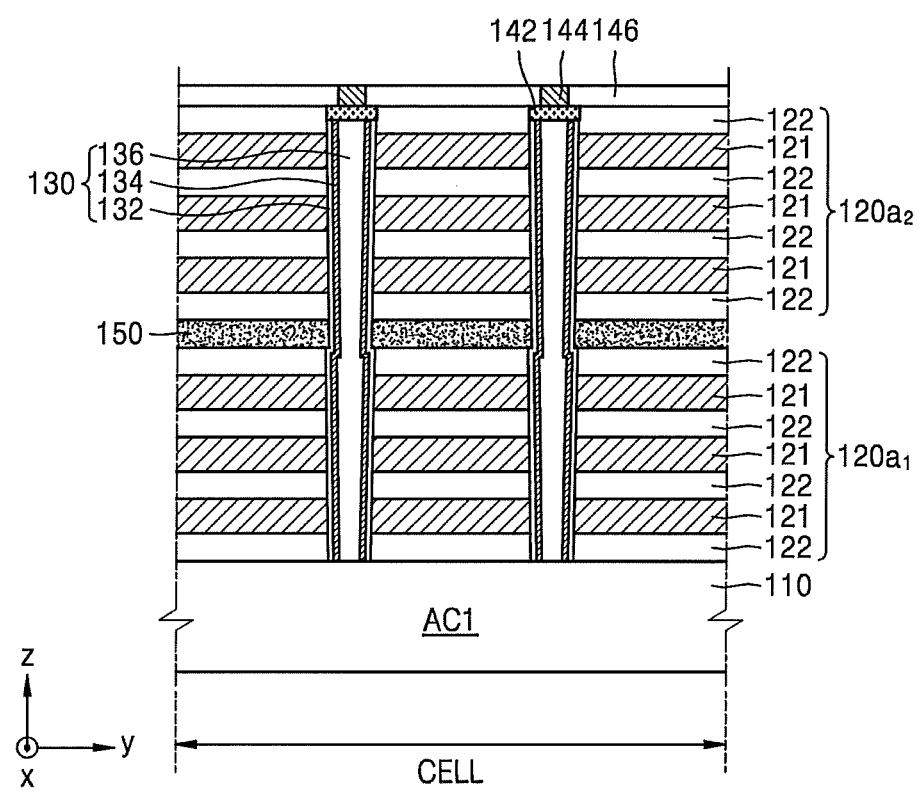
Figure 29:
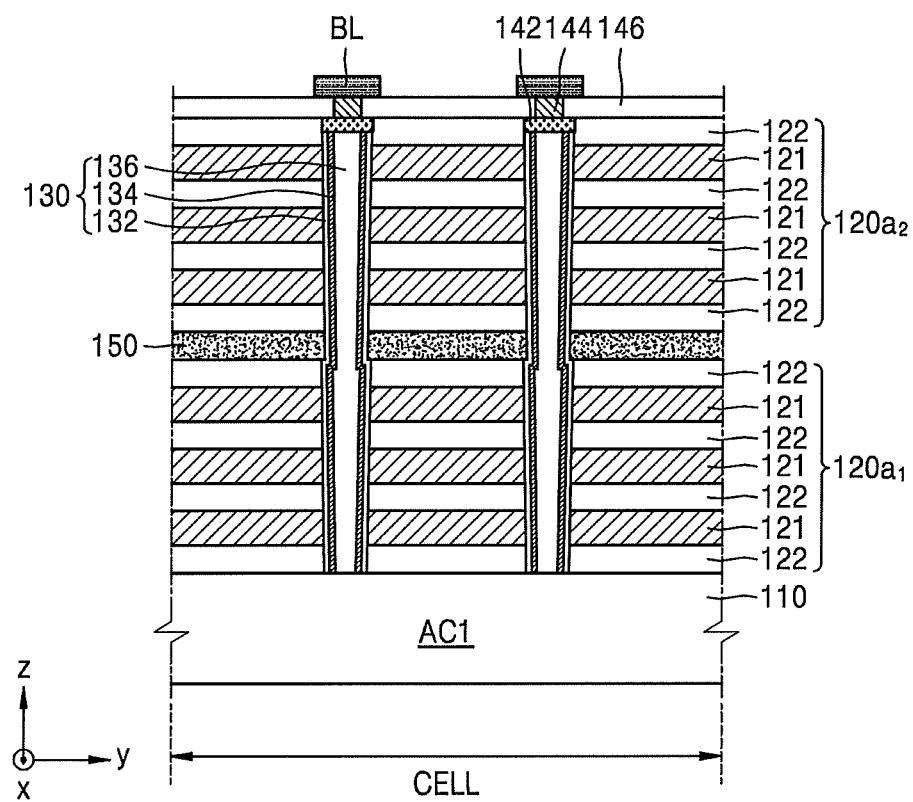

Referring to FIGS. 12 and 25, in operation P1016, the sacrificing film patterns 128 may be replaced with gate electrodes 121. Although not shown, in some embodiments, the first inter-structure layer 150 formed on the second active region AC2 of the peripheral circuit region PERI may be removed in an operation for forming word line contacts. However, the inventive concept is not limited thereto, and the first inter-structure layer 150 formed on the second active region AC2 may remain.

Referring to FIG. 12 and FIGS. 26 through 29, in operation P1016, conductive pads 142, an upper insulation film 146, bit line contacts 144, and bit lines may be provided according to well understood fabrication processes.

Figure 30:
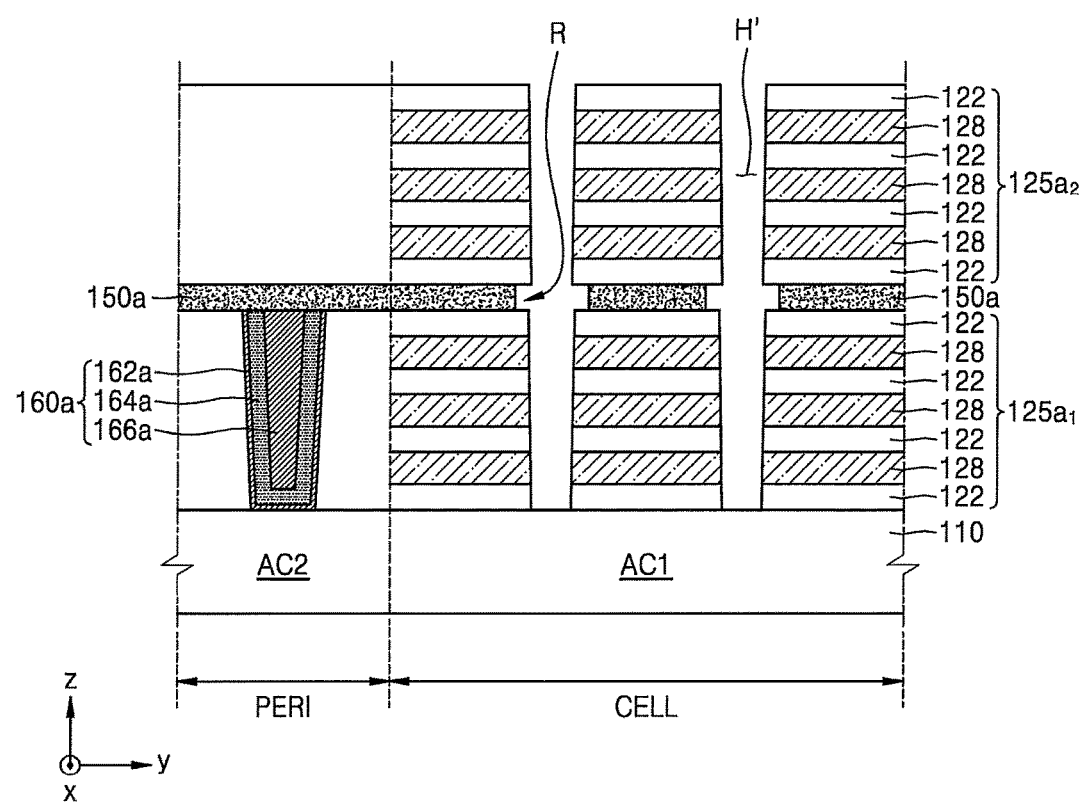
FIGS. 30 and 31 are sectional diagrams for describing a vertical memory device according to an embodiment of the inventive concepts.
Figure 31:
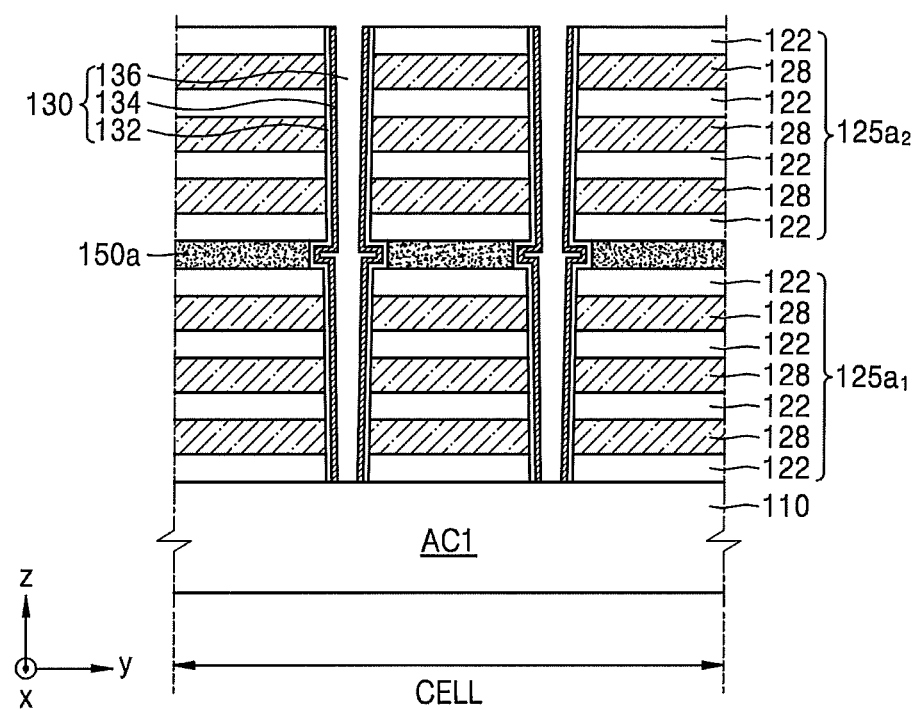

FIGS. 30 and 31 are diagrams for describing fabrication of a vertical memory device, according to an embodiment of the inventive concepts.

Hereinafter, for convenience of explanation, only those features that are different from those illustrated above with respect to FIGS. 13 through 29 are provided.

Referring to FIG. 30, the first sidewall protecting film 171 and the second sidewall providing film 170$a_2$ are removed, and thus recesses R may be formed. Therefore, channel holes H' including the recesses R may be formed. Therefore, the sectional profile of the channel holes H' may include a convex outward oriented profile at a level in the vicinity of the first inter-structure layer 150$a$.

Referring to FIG. 31, the channel structure 130 is provided, wherein the channel structure 130 include the dielectric film structures 132, the channels 134, and the channel burying film patterns 136 disposed inside the channels 134 and wherein the dielectric film structure 132, the channel 134, and the channel burying film pattern 136 are provided along the profile of the outer walls of the channel holes H' including the recesses R.

FIGS. 32 through 34, FIG. 36, and FIGS. 38 through 40 are diagrams for describing fabrication of vertical memory devices according to embodiments of the inventive concepts.

Figure 34:
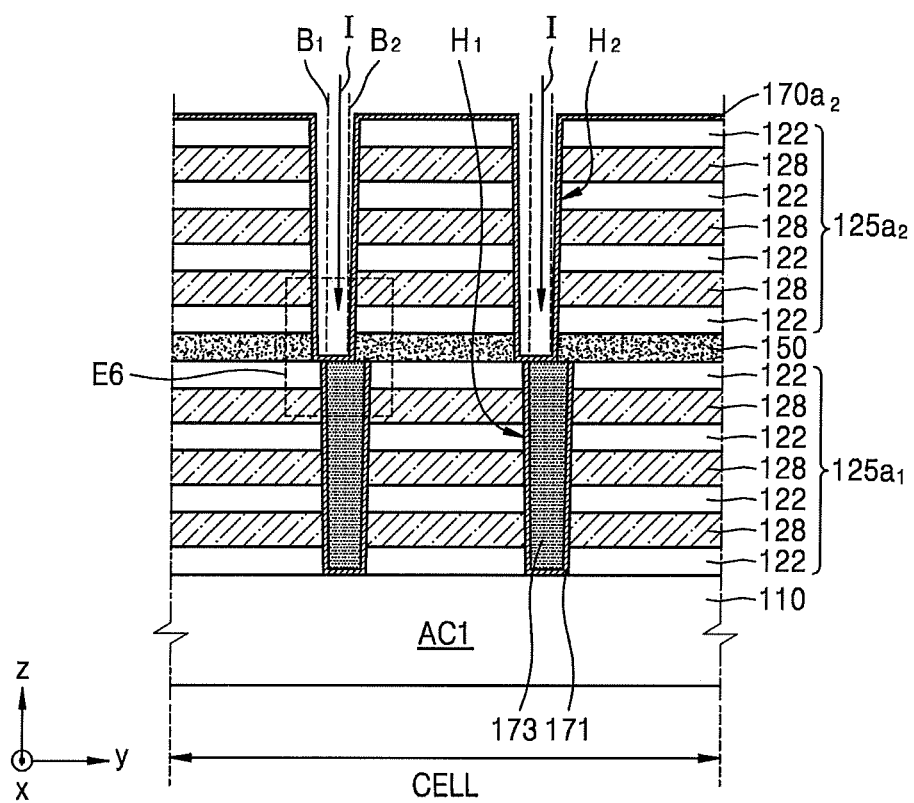
Figure 35:
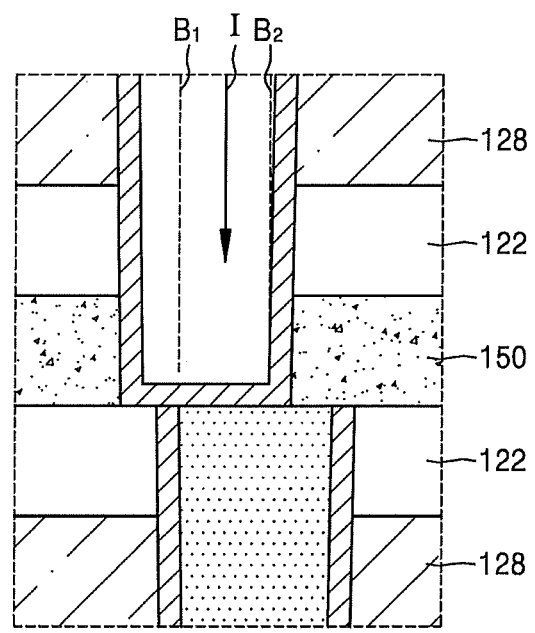
Figure 36:
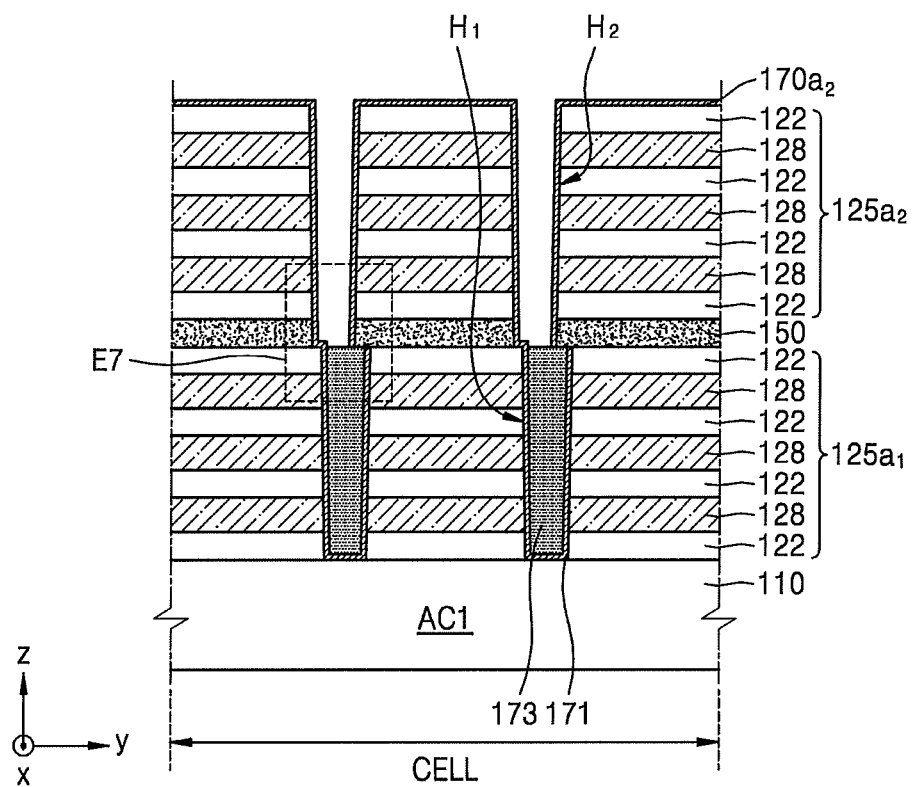
Figure 37:
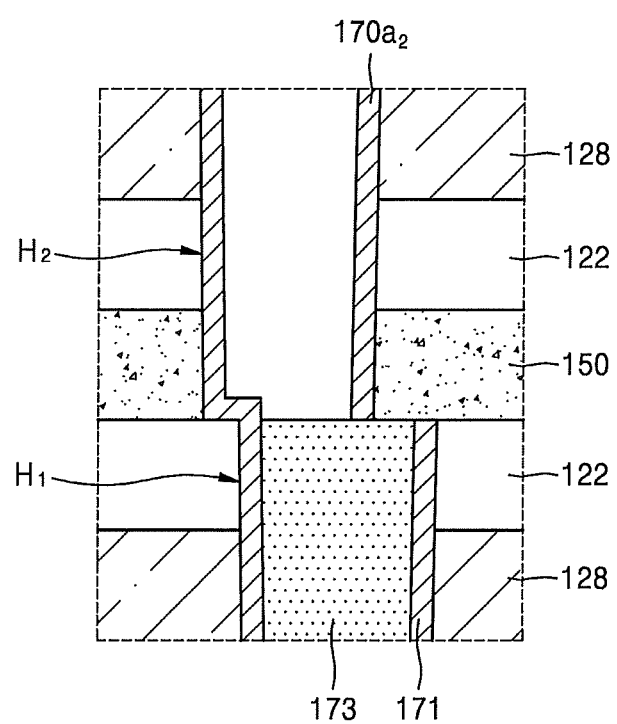
Figure 39:
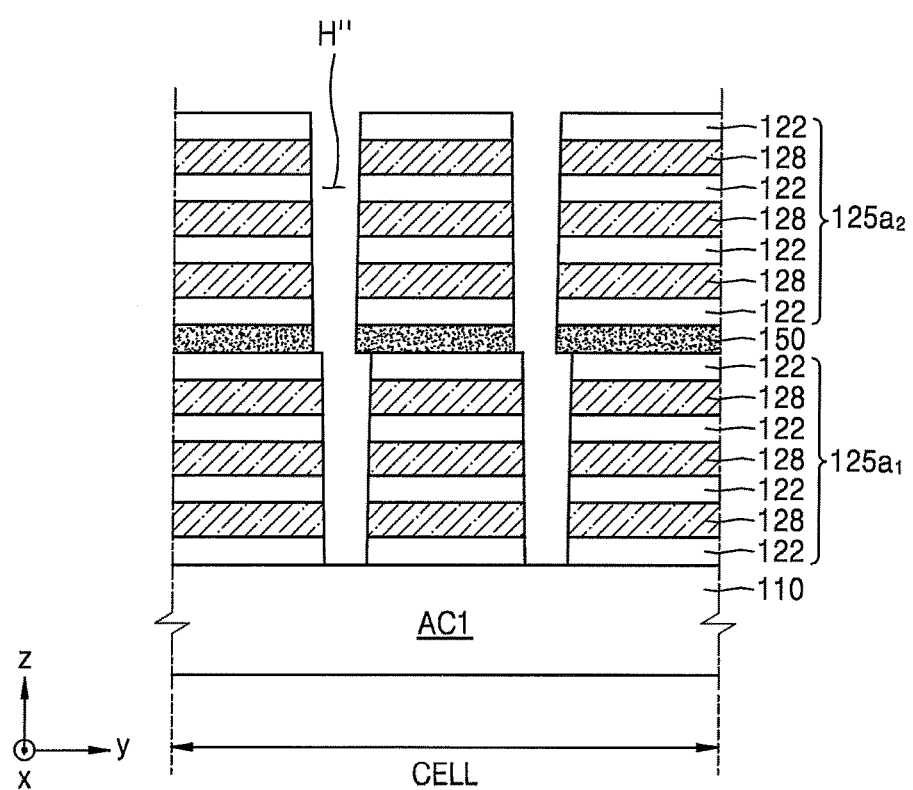
Figure 40:
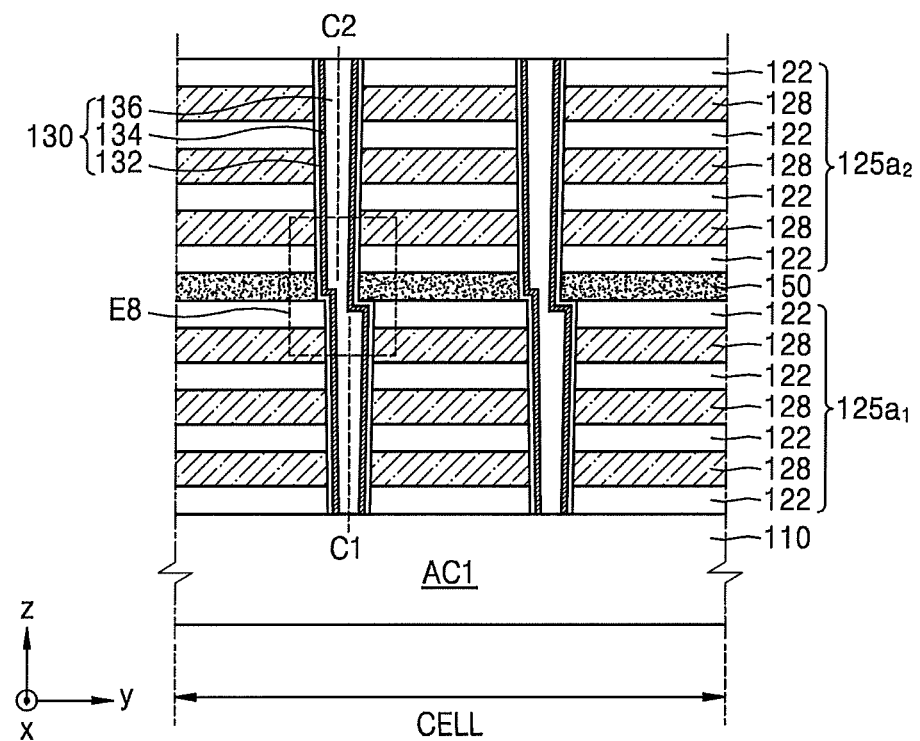

FIGS. 35, 37, and 40 are diagrams showing E6 of FIG. 34, E7 of FIG. 36, and E8 or FIG. 39 in closer detail, respectively.

Hereinafter, for convenience of explanation, only those features that are different from those illustrated above with respect to FIGS. 13 through 29 are provided.

Figure 32:
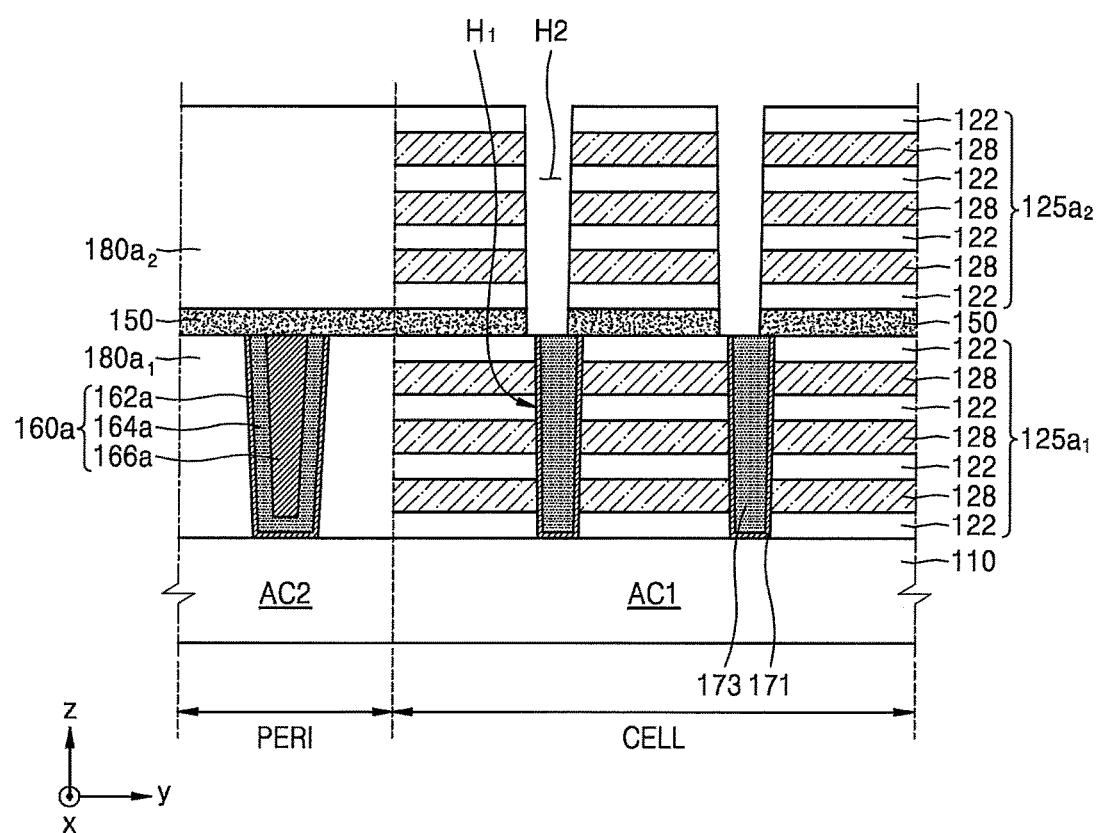
FIGS. 32 through 41 are sectional diagrams for describing fabrication of a vertical memory device, according to an embodiment of the inventive concepts.

Referring to FIG. 32, according to an embodiment of the inventive concept, the first channel holes H1 and the second channel holes H2 may be misaligned. The misalignment refers to an occurrence where the center axis of the first channel holes H1 in the first direction (z-axis direction) is not aligned with the center axis of the second channel holes H2 in the first direction (z-axis direction).

Figure 33:
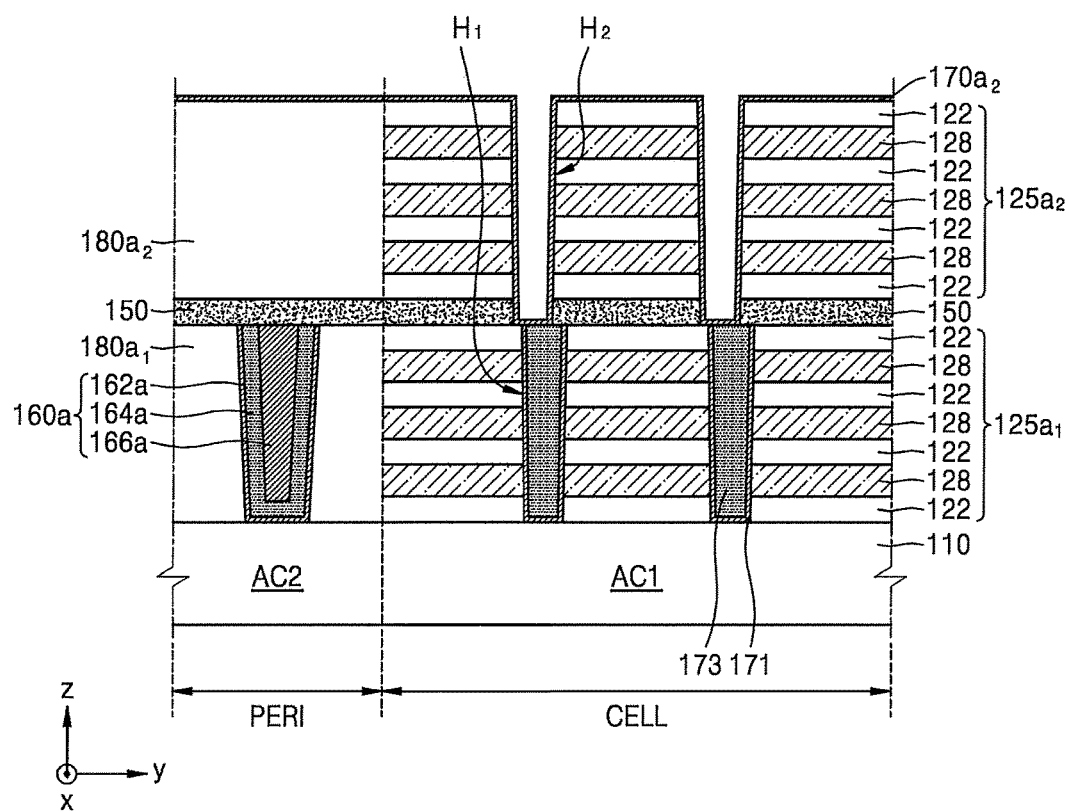

Referring to FIG. 33, the second sidewall providing film 170$a_2$ may be conformally provided on the second mold 125$a_2$ and the bottom and the sidewalls of the second channel holes H2.

Referring to FIGS. 34 and 35, at least a portion of the second sidewall providing film 170$a_2$ formed on the gap fill 173 may be dry-etched and removed. The arrow I indicates that a dry-etching operation including a sputtering etching operation, a reactive ion etching operation, and a vapour phase etching is performed. In detail, referring to FIG. 34, the second sidewall providing film 170$a_2$ between a first boundary B1 and a second boundary B2 may be selectively removed. In some embodiments, a portion of the upper portion of the gap fill 173 may be removed together or the second sidewall providing film 170$a_2$ formed on the gap fill 173 may be selectively removed.

Referring to FIGS. 36 and 37, the second sidewall providing film 170$a_2$ may be partially removed, thereby exposing the gap fill 173. When the second sidewall providing film 170$a_2$ is removed, the sacrificing film patterns 128 of the first mold 125$a_1$ are not exposed.

Figure 38:
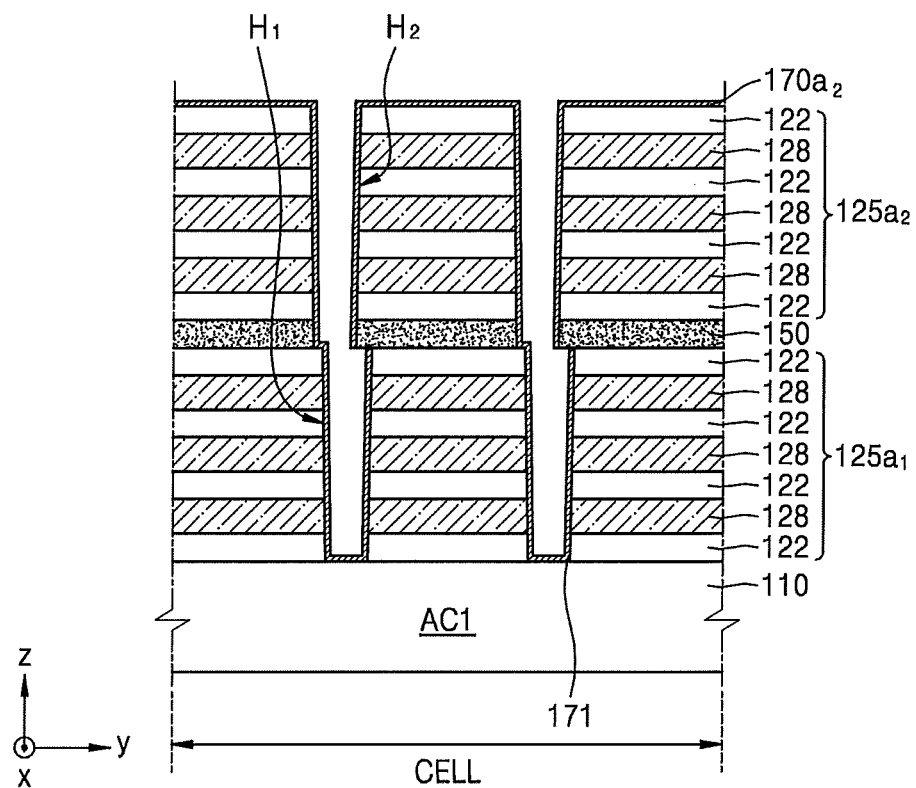

Referring to FIG. 38, the gap fill 173 may be removed, where a wet-etching operation may be performed therefor. If the gap fill 173 exhibits high etching selectivity with respect to the first sidewall protecting film 171, the second sidewall providing film 170$a$2, and the first inter-structure layer 150, the gap fill 173 may be selectively removed, thereby protecting the sacrificing film patterns 128.

Referring to FIG. 39, the first sidewall protecting film 171 and the second sidewall providing film 170$a_2$ may be removed, where a wet-etching operation may be performed therefor. Although not shown, a portion of the first inter-structure layer 150 may be etched together and recessed. If the first sidewall protecting film 171, the second sidewall providing film 170$a_2$, and the first inter-structure layer 150 exhibit high etching selectivity with respect to the sacrificing film patterns 128, the first sidewall protecting film 171 and the second sidewall providing film 170$a_2$ may be selectively removed, thereby protecting the sacrificing film patterns 128. Therefore, channel holes H" penetrating through the first mold 125$a_1$ and the second mold 125$a_2$ are formed.

Figure 41:
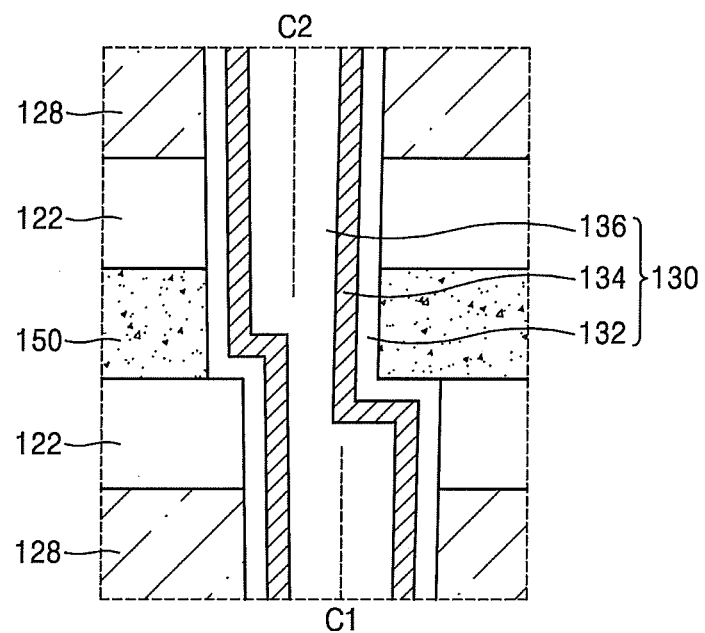

Referring to FIGS. 40 and 41, the channel structure 130 including the channels 134, the dielectric film structures 132 surrounding the outer walls of the channels 134, and the channel burying film patterns 136 disposed inside the channels 134 is provided. Although not shown, the channel structure 130 may be formed by conformally forming a dielectric film structure providing film, a channel providing film, and a burying film pattern providing film on the channel holes H" and the second mold 125$a_2$ in the order stated and etching the dielectric film structure providing film, the channel providing film, and the burying film pattern providing film to expose the uppermost insulation film patterns 122. The dielectric film structure providing film, the channel providing film, and the burying film pattern providing film may be formed in one of various operations including an atomic layer deposition and a chemical vapour deposition. The operation for etching the dielectric film structure providing film, the channel providing film, and the burying film pattern providing film may include a chemical mechanical polishing (CMP) operation and/or an etch-back operation.

Figure 42:
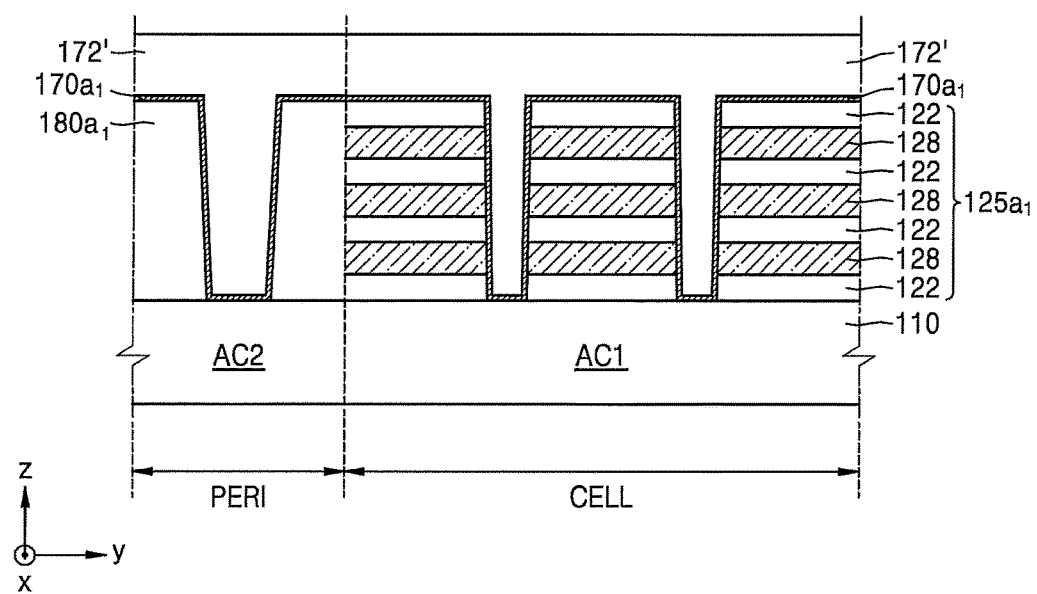
FIGS. 42 and 43 are sectional diagrams for describing fabrication of a vertical memory device, according to an embodiment of the inventive concepts.
Figure 43:
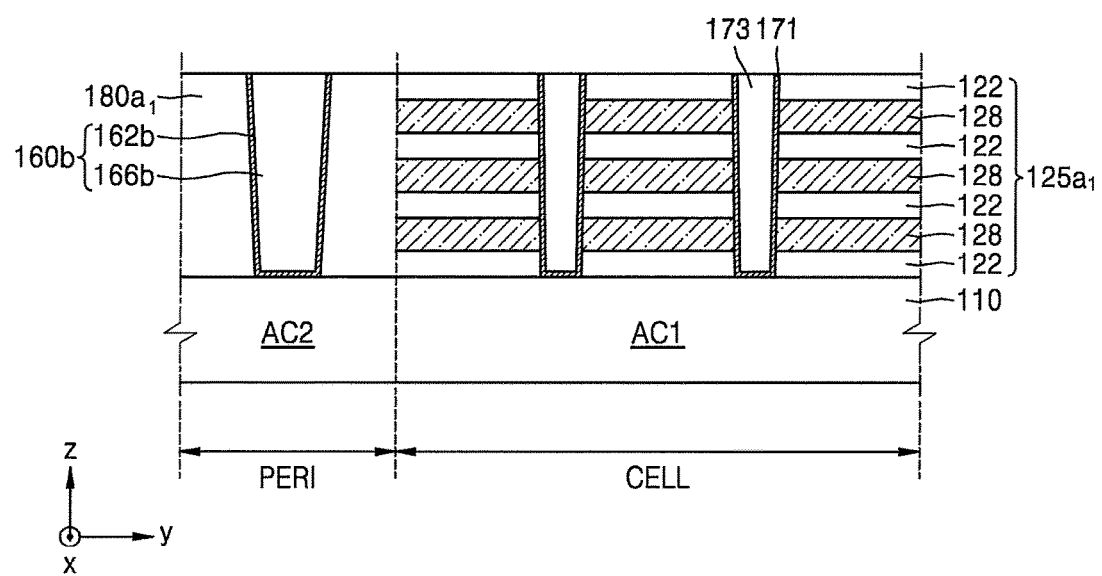

FIGS. 42 and 43 are diagrams for describing fabrication of a vertical memory device, according to an embodiment of the inventive concepts.

Hereinafter, for convenience of explanation, only those features that are different from those illustrated above with respect to FIGS. 13 through 29 are provided.

Referring to FIG. 42, the first sidewall providing film 170$a_1$ and a gap fill providing film 172' may be provided.

The first sidewall providing film $170a_1$ may be conformally provided on the top surface of the first mold $125a_1$, the top surface of the first filling oxide $180a_1$, the sidewalls and the bottom of the key hole KH, and the sidewalls and the bottom of the first channel holes H1.

The gap fill providing film 172' may be provided on the first sidewall providing film $170a_1$. In some embodiments, the gap fill providing film 172' may be provided to slightly fill the first channel holes H1. In some embodiments, the gap fill providing film 172' may be provided to slightly fill the key hole KH.

Referring to FIG. 43, the first sidewall providing film $170a_1$ and the gap fill providing film 172' may be planarized until the uppermost insulation film pattern 122 is exposed. Therefore, an alignment key 160b including a key outer film 162b conformally disposed on the bottom and the sidewalls of the key hole KH and a key filler 166b disposed inside the key outer film 162b may be formed in the peripheral circuit region PERI, whereas the first sidewall protecting film 171 conformally provided on the bottom and the sidewalls of the first channel holes H1 and the gap fill 173 disposed inside the first sidewall protecting film 171 may be formed in the cell array region CELL. The planarizing operation may include a chemical mechanical polishing (CMP) operation and/or an etch-back operation.

FIGS. 44-47 are diagrams for describing fabrication of a vertical memory device, according to an embodiment of the inventive concept.

Hereinafter, for convenience of explanation, only those features that are different from those illustrated above with respect to FIGS. 13 through 29 are provided.

Figure 44:
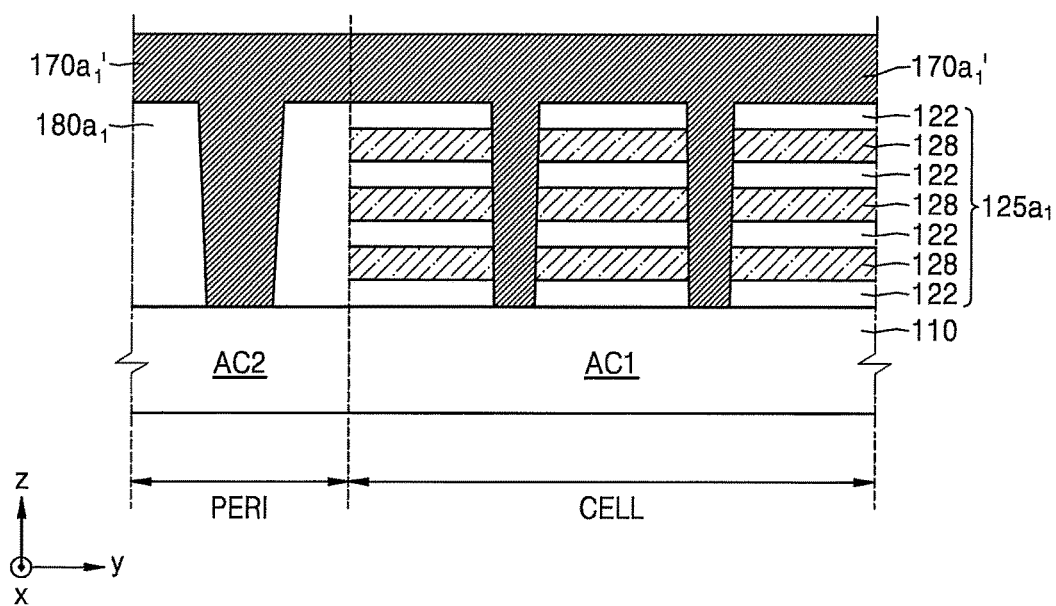
FIGS. 44 through 47 are sectional diagrams for describing fabrication of a vertical memory device, according to an embodiment of the inventive concepts.

Referring to FIG. 44, a first sidewall providing film $170a_1$' may be provided on the top surface of the first mold $125a_1$, the first filling oxide $180a_1$, the sidewalls and the bottom of the key hole KH, and the sidewalls and the bottom of the first channel holes H1.

In some embodiments, the first sidewall providing film $170a_1$' may be provided to slightly fill the first channel holes H1 In some embodiments, the first sidewall providing film $170a_1$' may be provided to slightly fill the key hole KH.

Figure 45:
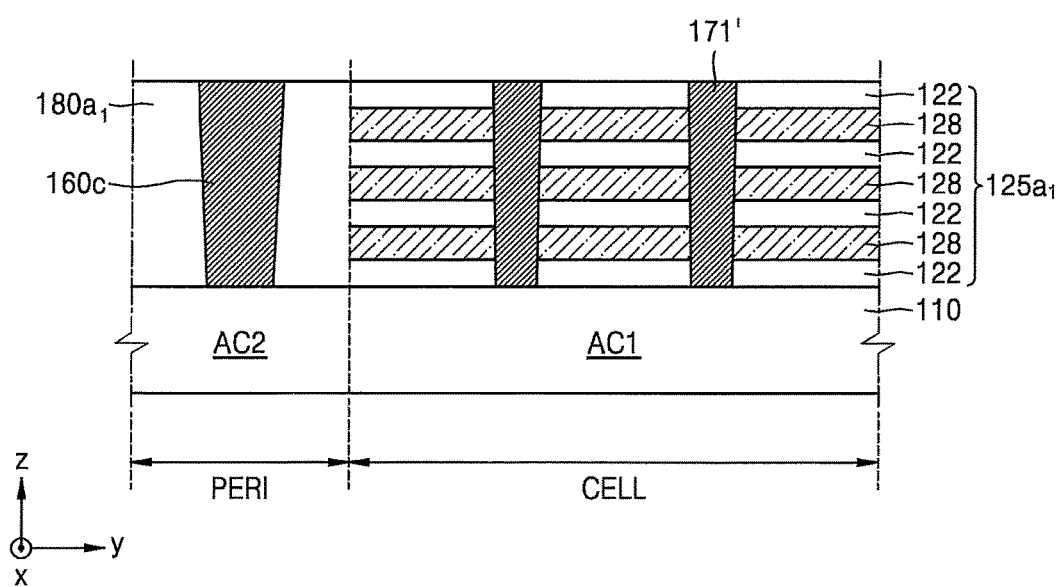

Referring to FIG. 45, the first sidewall providing film $170a_1$' may be planarized until the uppermost insulation film patterns 122 is exposed. Therefore, an alignment key 160c filling the key hole KH may be formed in the peripheral circuit region PERI, whereas a first sidewall protecting film 171' filling the first channel holes H1 may be formed in the cell array region CELL. The planarizing operation may include a chemical mechanical polishing (CMP) operation and/or an etch-back operation. If the first sidewall protecting film 171' exhibits high etching selectivity with respect to the sacrificing film patterns 128, the first sidewall protecting film 171' may be selectively removed in a later operation, thereby protecting the sacrificing film patterns 128.

Figure 46:
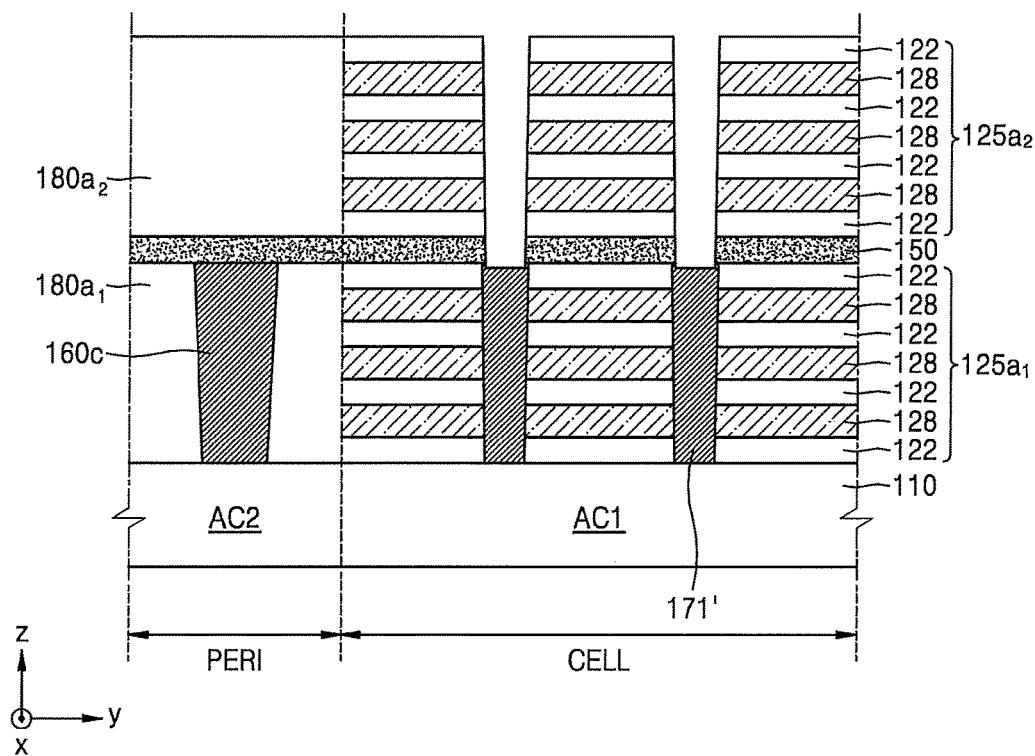
Figure 47:
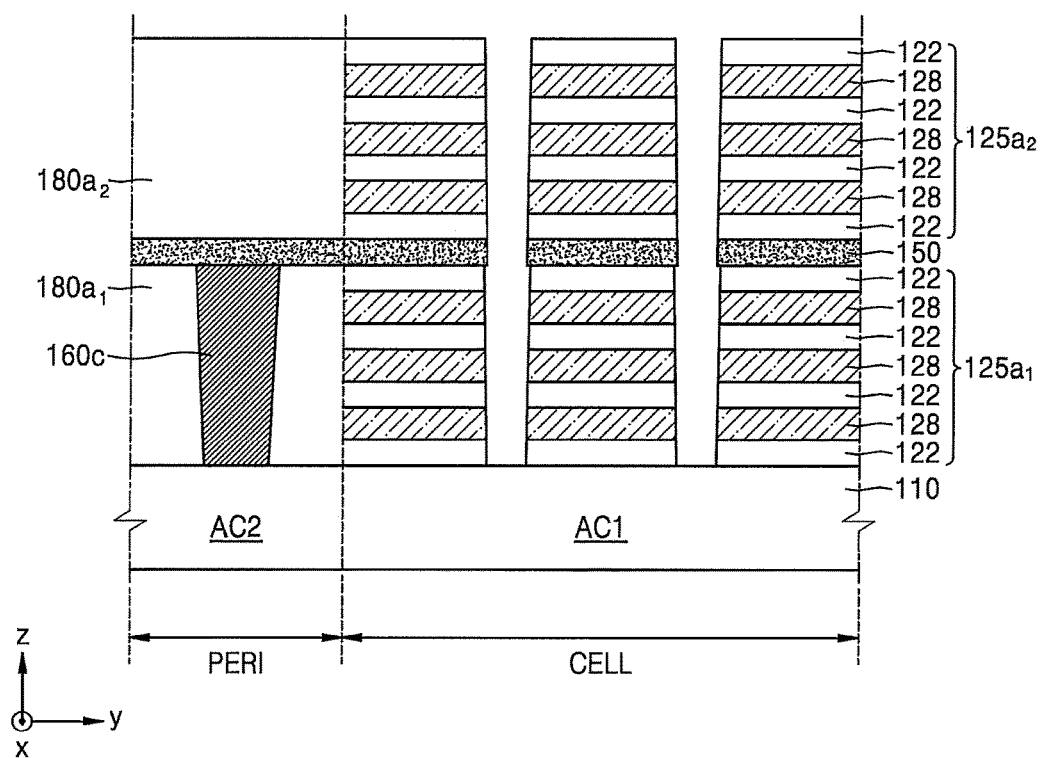

Referring to FIG. 46, an inter-layer-structure 150 is applied to the first mold 125a1. A second mold $125a_2$ is positioned on the inter-layer structure 150. Openings are provided in the second mold $125a_2$ above the first sidewall protecting films 171'. During etching of the openings in the second mold 125a2, the first sidewall protecting films 171' prevent or mitigate overetching of the sidewalls of the openings in the first mold 125a1. As shown in FIG. 47, the first sidewall protecting films are then removed and the fabrication operation proceeds.

Figure 48:
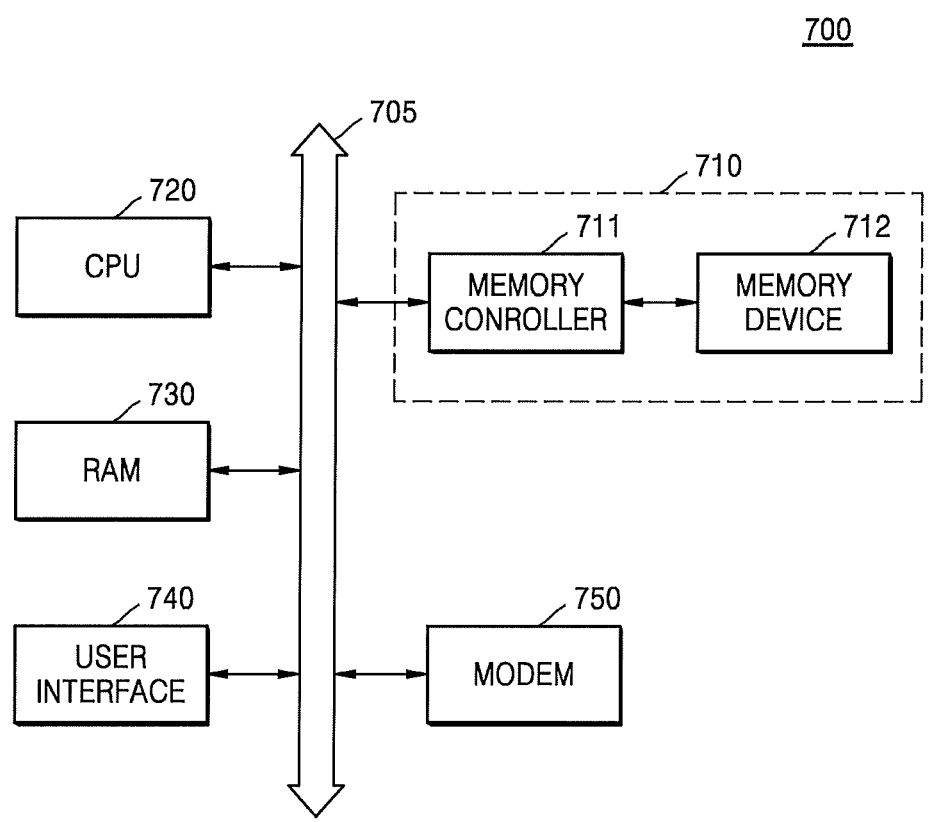
FIG. 48 is a block diagram showing the configuration of an information processing system according to an embodiment of the inventive concepts.

FIG. 48 is a block diagram showing the configuration of an information processing system 700 according to an embodiment of the inventive concept.

Referring to FIG. 48, the information processing system 700 may include a memory system 710, a central processing unit (CPU) 720, RAM 730, a user interface 740, and a modem 750 like a baseband chipset, where the memory system 710, the CPU 720, the RAM 730, the user interface 740, and the modem 750 are electrically connected to a system bus 705. The memory system 710 may include a memory controller 711 and a memory device 712. The memory device 712 may include a vertical memory device according to the embodiments described above with reference to FIGS. 1 through 12B. Therefore, data processed by the CPU 720 or large amount of data input from outside may be stably stored. The memory controller 711 is configured to be able to control the memory device 712. As the memory device 712 is combined with the memory controller 711, the memory system 710 may be provided as a memory card or a solid state disk (SSD). If the information processing system 700 is a mobile apparatus, a battery for supplying operation voltage for the information processing system 700 may be additionally provided. Although not shown, the information processing system 700 may further include an application chipset, a camera image processor (CIS), mobile DRAM, etc.

In methods of fabricating vertical memory devices according to embodiments of the inventive concept, the overall fabrication process may be simplified by simultaneously forming at least some of common source line contact plugs, cell gate line contact plugs, and peripheral circuit contact plugs. Therefore, cost for fabricating a vertical memory device may be reduced. Furthermore, a highly-reliable vertical memory device without defects of the common source line contact plugs may be embodied.

While the inventive concept has been particularly shown and described with reference to embodiments thereof, it will be understood that various changes in form and details may be made therein without departing from the spirit and scope of the following claims.

What is claimed is:

1. A vertical memory device comprising:
a substrate including a cell array region and a peripheral circuit region horizontally spaced apart from the cell array region;
a plurality of stacked structures comprising a plurality of gate electrodes and a plurality of insulation film patterns that are alternately and repeatedly stacked in the cell array region of the substrate in a first direction that is perpendicular to a top surface of the substrate, and the plurality of stacked structures extending in a second direction that is parallel to the top surface of the substrate;
at least one inter-structure layer positioned between two stacked structures adjacent to each other from among the plurality of stacked structures;
a channel structure that penetrates the plurality of stacked structures and the at least one inter-structure layer, the channel structure extending in the first direction, the channel structure being connected to the substrate; and
an alignment key extending in the first direction in the peripheral circuit region, wherein the alignment key comprises:
a key outer film defining a bottom surface and a side wall of the alignment key and having a conformal shape, the bottom surface of the alignment key being in contact with the substrate;
a key inner film conformally filling at least a portion of an inner space of the key outer film; and a key filler completely filling an inner space of the key inner film and including the same material as the key outer film, wherein a width of the alignment key is larger than a width of the channel structure.

2. The vertical memory device of claim 1, wherein the plurality of stacked structures comprise a first stacked structure closest to the substrate and a second stacked structure closest to the first stacked structure, and wherein the at least one inter-structure layer comprises a first inter-structure layer positioned between the first stacked structure and the second stacked structure.

3. The vertical memory device of claim 2, wherein the first stacked structure comprises a first uppermost layer contacting the first inter-structure layer, wherein the second stacked structure comprises a second lowermost layer contacting the first inter-structure layer, and wherein at least one of the first uppermost layer and the second lowermost layer comprises an insulation film pattern.

4. The vertical memory device of claim 2, wherein the first inter-structure layer is recessed in the second direction relative to inner sidewalls of at least one of the first stacked structure and the second stacked structure.

5. The vertical memory device of claim 2, wherein a sectional profile of the channel structure comprises a portion extending in a convex outward orientation in the second direction at a position in the first direction corresponding to that of the inter-structure layer.

6. The vertical memory device of claim 2, wherein a center axis of the channel structure along the first direction corresponding to the first stacked structure and a center axis of the channel structure along the first direction corresponding to the second stacked structure are misaligned with each other.

7. The vertical memory device of claim 1 wherein the key outer film comprises a material different from the plurality of insulation film patterns.

8. The vertical memory device of claim 1 wherein the key outer film comprises a polycrystalline material.

9. The vertical memory device of claim 1, wherein a height of a first stacked structure of the plurality of stacked structures relative to the substrate in the first direction is equal to or greater than a height of the alignment key relative to the substrate in the first direction.

10. The vertical memory device of claim 1 wherein a top surface of the inter-structure layer is higher than a top surface of the alignment key.

11. The vertical memory device of claim 1 wherein a bottom surface of the inter-structure layer is level with a top surface of the alignment key.

12. A vertical memory device comprising:
a substrate including a cell array region and a peripheral circuit region horizontally spaced apart from the cell array region;
stacked structures, the stacked structures comprising gate electrodes and insulation film patterns that are alternately stacked in the cell array region of the substrate in a first direction that is perpendicular to a top surface of the substrate, the stacked structures extending in a second direction that is parallel to the top surface of the substrate;
an inter-structure layer between two stacked insulation film patterns adjacent to each other from among the insulation film patterns;
a channel structure that penetrates the stacked structures and the inter-structure layer, the channel structure contacting the substrate, and connected to the substrate,
wherein a horizontal cross-sectional area of the channel structure parallel to the top surface of the substrate varies in the first direction; and
an alignment key extending in the first direction in the peripheral circuit region, wherein the alignment key comprises:
a key outer film defining a bottom surface and a side wall of the alignment key and having a conformal shape, the bottom surface of the alignment key being in contact with the substrate;
a key inner film conformally filling at least a portion of an inner space of the key outer film; and
a key filler completely filling an inner space of the key inner film and including the same material as the key outer film,
wherein a width of the alignment key is larger than a width of the channel structure.

13. The vertical memory device of claim 12, wherein the horizontal cross-sectional area of a first portion of the channel structure corresponding to a first stacked structure of the stacked structures is greatest at a position proximal to the inter-structure layer.

14. The vertical memory device of claim 12, wherein the horizontal cross-sectional area of the channel structure is discontinuous at a position proximal to the inter-structure layer.

15. The vertical memory device of claim 12, wherein the horizontal cross-sectional area of the channel structure varies at a highest rate at a position proximal to the inter-structure layer.

16. A vertical memory device comprising:
a first stack structure comprising a plurality of gate electrodes and a plurality of insulation film patterns alternately stacked;
a second stack structure comprising a plurality of gate electrodes and a plurality of insulation film patterns alternately stacked;
the first stack structure positioned on a substrate, the second stack structure positioned on the first stack structure in a vertical direction relative to the substrate, the substrate extending in a horizontal direction;
an inter-structure layer between the first stack structure and the second stack structure; and
a channel structure penetrating the first stack structure, the inter-structure layer and the first stack structure in the vertical direction, the channel structure in contact with the substrate, the channel structure including a first channel structure portion extending through the first stack structure and a second channel structure portion extending through the second stack structure; the first channel structure portion having a width that reduces in a direction from a top to a bottom of the first channel structure portion relative to the substrate, the second channel structure portion having a width that reduces in a direction from a top to a bottom of the second channel structure portion relative to the substrate; the channel structure changing in width at a vertical position proximal the inter-structure layer,
wherein the channel structure is positioned in a cell region of the vertical memory device and further comprising an alignment key positioned in a peripheral region of the vertical memory device spaced apart from the cell region in the horizontal direction, wherein the alignment key and the inter-structure layer comprise a polycrystalline material, and wherein the inter-structure layer extends both in the cell region and in the peripheral region.

17. The vertical memory device of claim 16 wherein the first channel structure portion has a first vertical axis, and wherein the second channel structure portion has a second axis, the first and second axes being misaligned.

18. The vertical memory device of claim 16 wherein the channel extends outwardly in the horizontal direction at a vertical position corresponding to the inter-structure layer.

19. The vertical memory device of claim 16 wherein a top surface of the inter-structure layer is higher than a top surface of the alignment key and a bottom surface of the inter-structure layer is level with a top surface of the alignment key.

20. The vertical memory device of claim 16 wherein the alignment key comprises multiple layers.

\* \* \* \* \*